(12) United States Patent
Takakuwa

(10) Patent No.: US 9,966,284 B2
(45) Date of Patent: May 8, 2018

(54) ALIGNMENT METHOD, PATTERN FORMATION SYSTEM, AND EXPOSURE DEVICE

(71) Applicant: Toshiba Memory Corporation, Minato-ku (JP)

(72) Inventor: Manabu Takakuwa, Tsu (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 128 days.

(21) Appl. No.: 15/015,468

(22) Filed: Feb. 4, 2016

(65) Prior Publication Data

US 2017/0148656 A1 May 25, 2017

(30) Foreign Application Priority Data

Nov. 19, 2015 (JP) ................ 2015-226578

(51) Int. Cl.
| | |
|---|---|
| *G03B 27/68* | (2006.01) |
| *H01L 21/67* | (2006.01) |
| *G03F 7/20* | (2006.01) |
| *H01L 23/544* | (2006.01) |

(52) U.S. Cl.
CPC .... *H01L 21/67259* (2013.01); *G03F 7/70141* (2013.01); *H01L 23/544* (2013.01); *H01L 2223/54426* (2013.01)

(58) Field of Classification Search
CPC ............. G03F 7/70141; G03F 7/70725; G03F 7/70891
USPC ........................ 355/52, 53, 55, 67
See application file for complete search history.

(56) References Cited

U.S. PATENT DOCUMENTS

| | | | |
|---|---|---|---|
| 7,433,051 B2 | 10/2008 | Owen | |
| 7,847,954 B2 | 12/2010 | Tang et al. | |
| 8,111,376 B2 | 2/2012 | Adel et al. | |
| 8,175,831 B2 | 5/2012 | Izikson et al. | |
| 8,630,479 B2 | 1/2014 | Chen et al. | |
| 8,703,368 B2 | 4/2014 | Lee et al. | |
| 8,768,665 B2 | 7/2014 | Veeraraghavan et al. | |
| 9,031,810 B2 | 5/2015 | Chen et al. | |
| 9,177,370 B2 | 11/2015 | Chen et al. | |
| 2001/0026897 A1* | 10/2001 | Shima ................. | G03F 7/70358 430/22 |
| 2003/0174298 A1* | 9/2003 | Yoshimura ............. | G03B 27/68 355/52 |
| 2007/0076180 A1* | 4/2007 | Tinnemans ......... | G03F 7/70725 355/53 |
| 2008/0316442 A1 | 12/2008 | Adel et al. | |
| 2012/0208301 A1 | 8/2012 | Izikson et al. | |
| 2013/0089935 A1 | 4/2013 | Vukkadala et al. | |

(Continued)

FOREIGN PATENT DOCUMENTS

| | | |
|---|---|---|
| JP | 2003-59808 | 2/2003 |
| JP | 2009-529785 | 8/2009 |

(Continued)

*Primary Examiner* — Hung Henry Nguyen
(74) *Attorney, Agent, or Firm* — Oblon, McClelland, Maier & Neustadt, L.L.P.

(57) ABSTRACT

According to one embodiment, an alignment method includes calculating a position gap of a predetermined point in a device area of a wafer based on a stress applied to the device area, and correcting an exposure condition in a lithography process of the device area based on the position gap of the predetermined point.

11 Claims, 20 Drawing Sheets

(56) References Cited

U.S. PATENT DOCUMENTS

| | | |
|---|---|---|
| 2013/0310966 A1 | 11/2013 | Macnaughton et al. |
| 2014/0107998 A1 | 4/2014 | Vukkadala et al. |
| 2015/0168852 A1* | 6/2015 | Beerens .............. G03F 7/70775 355/72 |

FOREIGN PATENT DOCUMENTS

| | | |
|---|---|---|
| JP | 2010-186918 | 8/2010 |
| JP | 2010-529659 | 8/2010 |
| JP | 2010-537394 | 12/2010 |
| JP | 2011-66323 | 3/2011 |
| JP | 2011-521235 | 7/2011 |
| JP | 2013-527972 | 7/2013 |
| JP | 2013-153167 | 8/2013 |
| JP | 2013-211010 | 10/2013 |
| JP | 2014-504803 | 2/2014 |
| JP | 2014-509070 | 4/2014 |
| JP | 2014-140058 | 7/2014 |
| JP | 2014-534631 | 12/2014 |
| JP | 2015-43452 | 3/2015 |

* cited by examiner

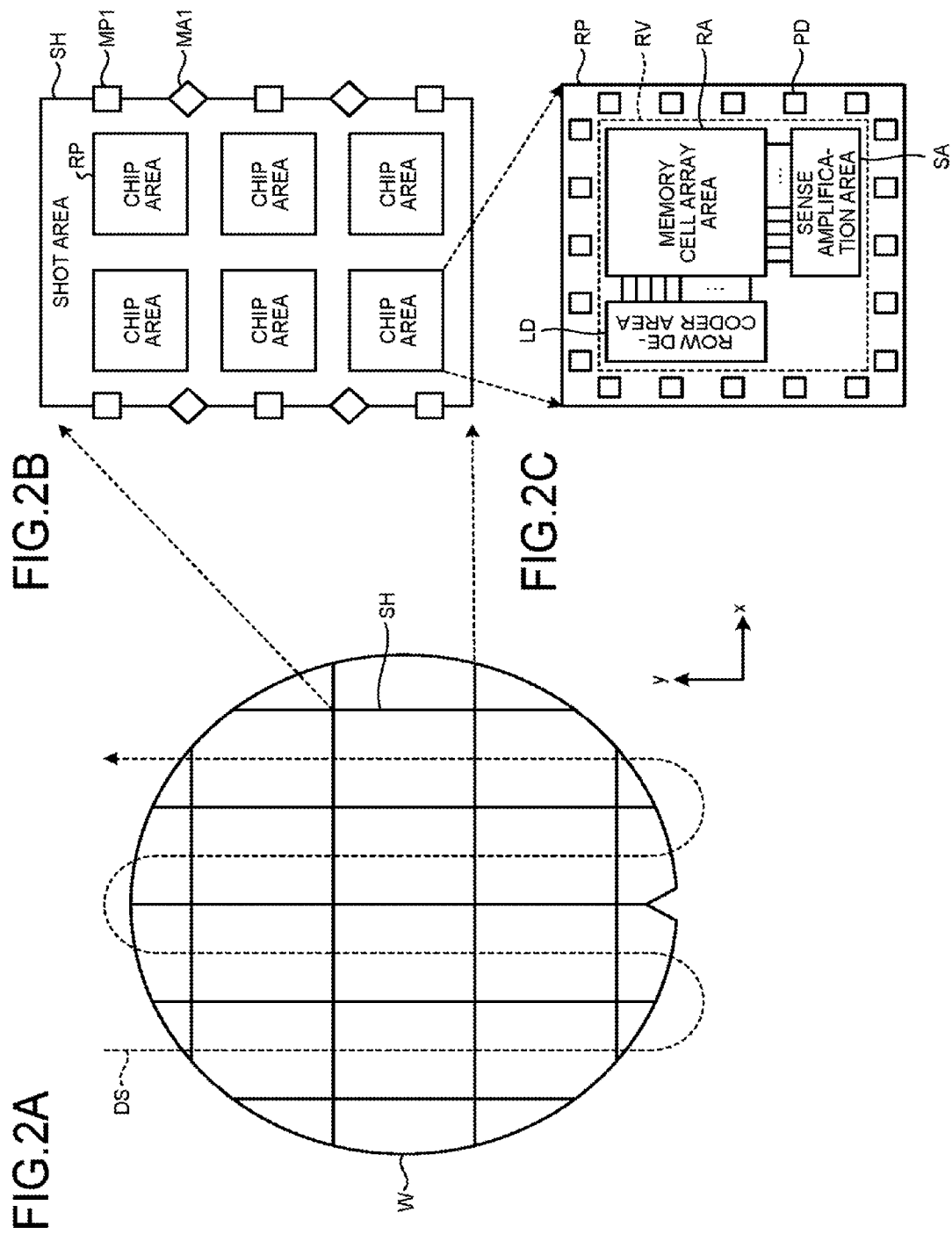

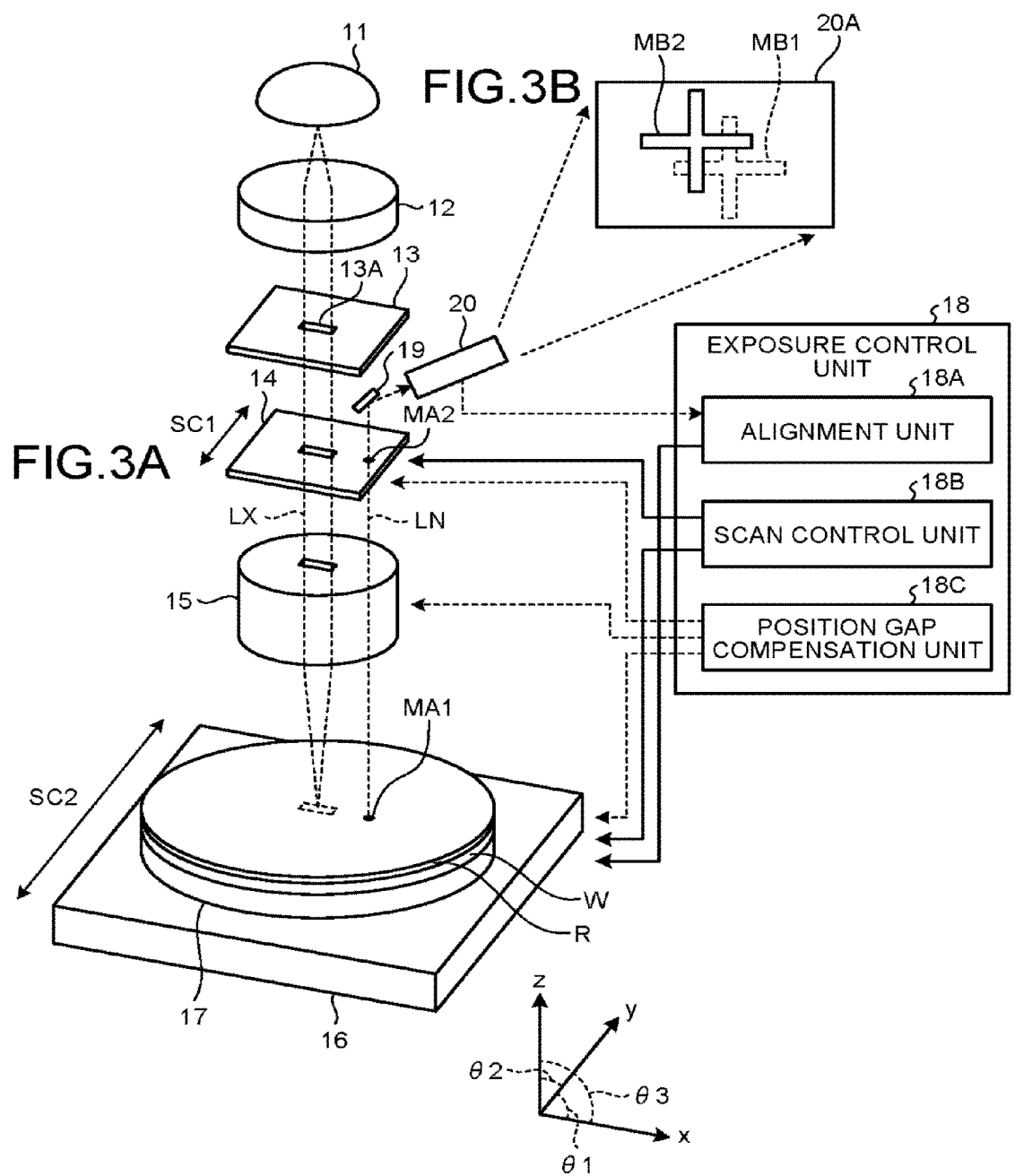

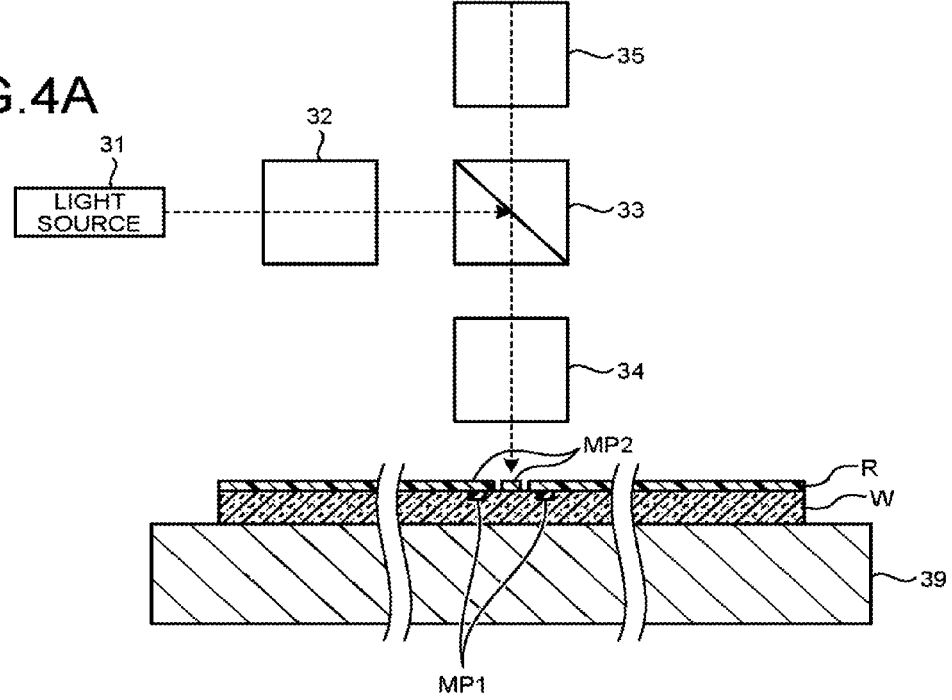
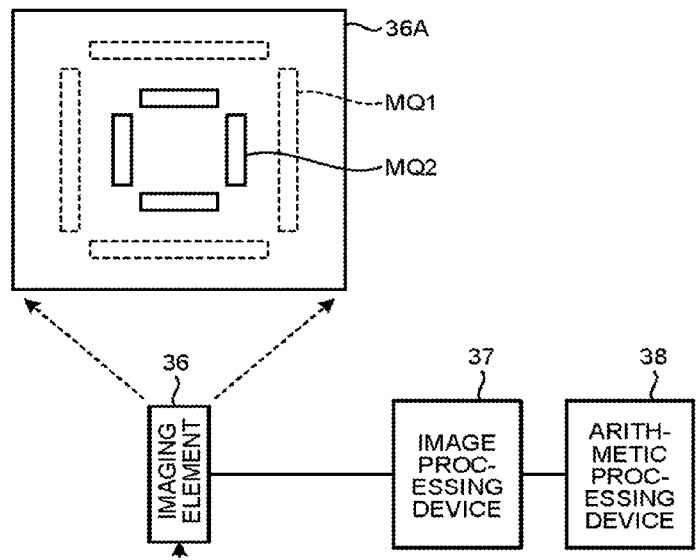

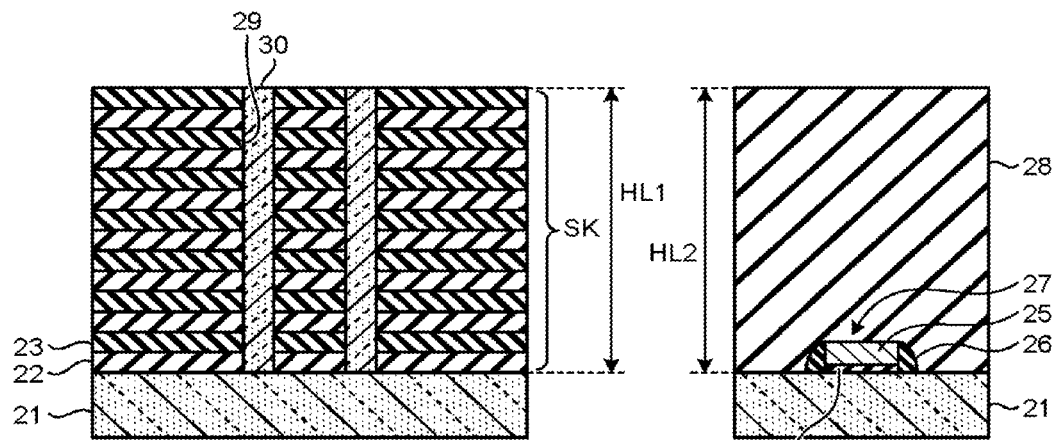
FIG.6A-1  FIG.6A-2
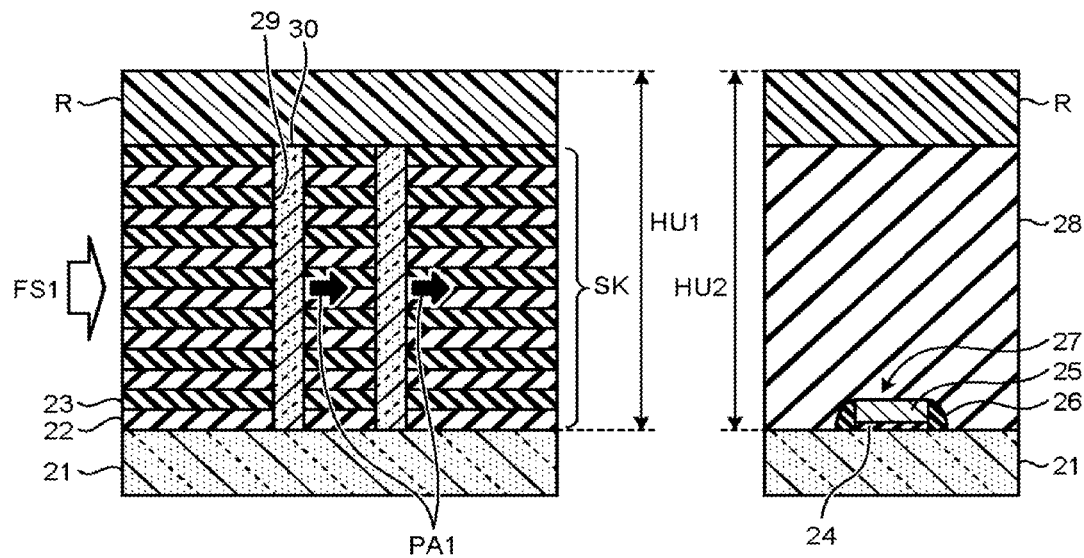
FIG.6B-1  FIG.6B-2
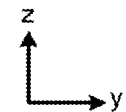

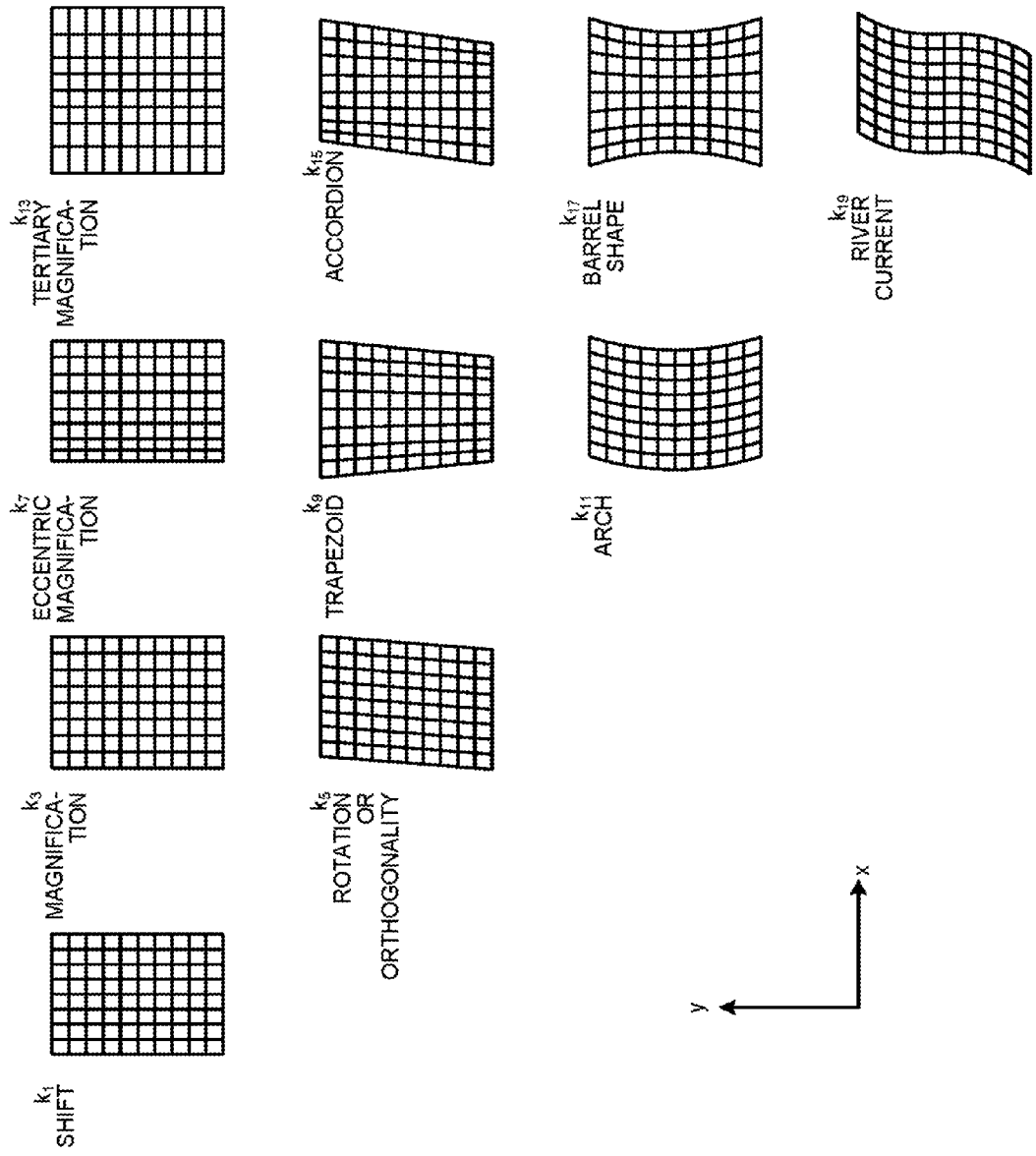

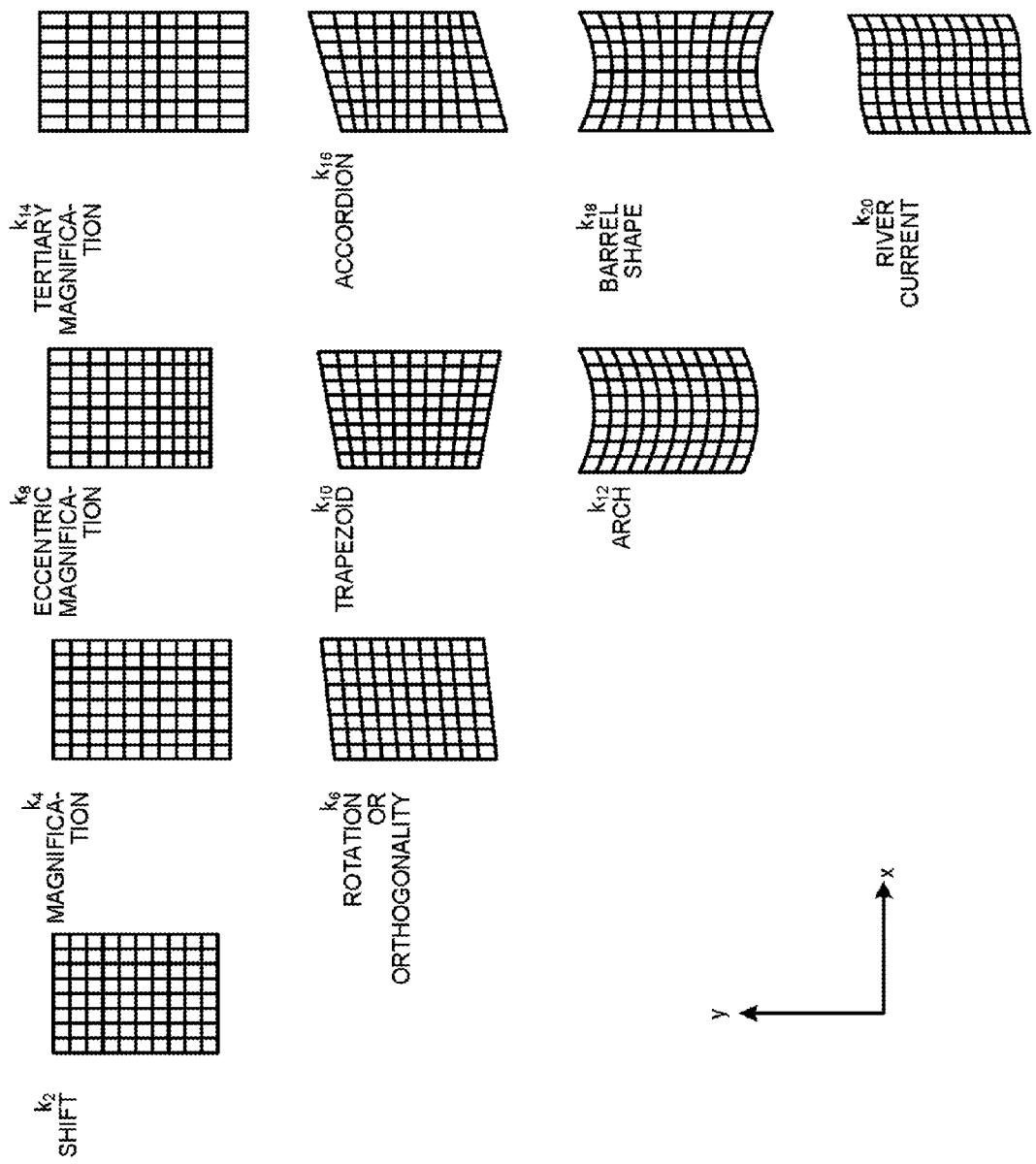

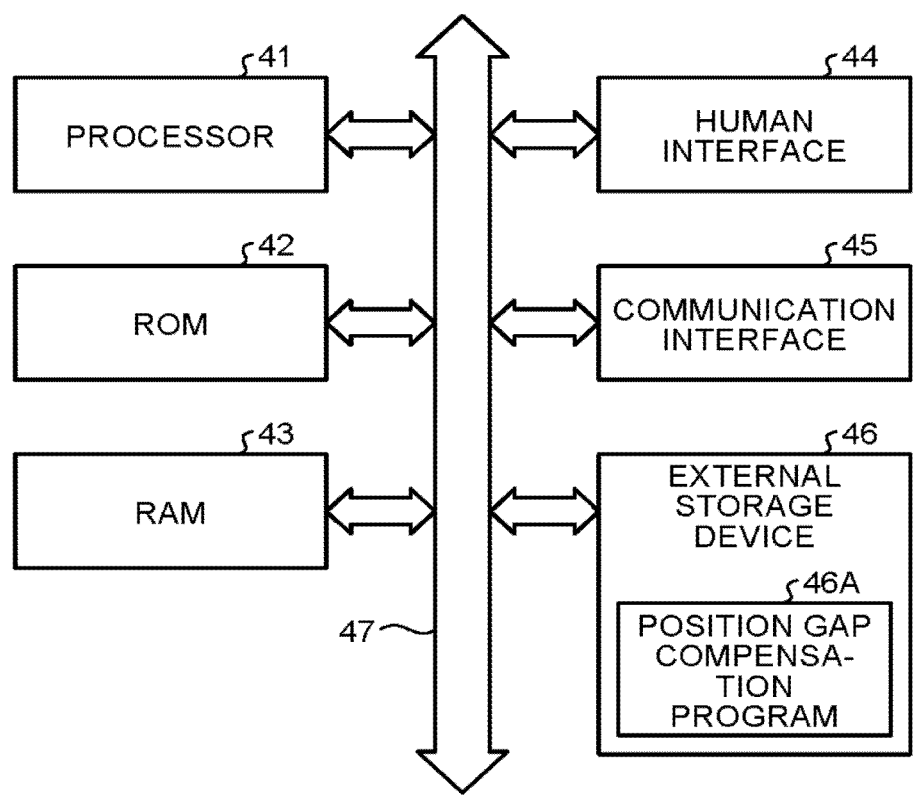

ALIGNMENT METHOD, PATTERN FORMATION SYSTEM, AND EXPOSURE DEVICE

CROSS-REFERENCE TO RELATED APPLICATIONS

This application is based upon and claims the benefit of priority front Japanese Patent Application No. 2015-226578, filed on Nov. 19, 2015; the entire contents of which are incorporated herein by reference.

FIELD

Embodiments described herein relate generally to an alignment method, a pattern formation system, and an exposure device.

BACKGROUND

At alignment between patterns in a photolithography process, the accuracy of alignment may be decreased by position gaps resulting from a stress on the pattern at the alignment destination.

BRIEF DESCRIPTION OF THE DRAWINGS

FIG. 2A is a planar view of an arrangement example of shot areas to which a pattern formation system according to a second embodiment is applied, FIG. 2B is a planar view of an arrangement example of chip areas in the shot area illustrated in FIG. 2A, and FIG. 2C is a planar view of an arrangement example of device areas arranged in the chip area illustrated in FIG. 2B;

FIG. 3A is a schematic perspective view of an exposure device applied to the pattern formation system illustrated in FIG. 1, and FIG. 3B is a planar view of an example of alignment marks detected in an alignment detection system illustrated in FIG. 3A;

FIG. 4A is a schematic block diagram of a misalignment checking device applied to the pattern formation system illustrated in FIG. 1, and FIG. 4B is a planar view of an example of position gap checking marks detected by an imaging element illustrated in FIG. 4A;

FIGS. 6A-1, 6A-2, 6B-1, and 6B-2 are cross-sectional views illustrating a pattern formation method to which an alignment method implemented in the pattern formation system illustrated in FIG. 1 is applied;

FIGS. 7A-1, 7A-2, 7B-1, and 7B-2 are cross-sectional views illustrating the pattern formation method to which the alignment method implemented in the pattern formation system illustrated in FIG. 1 is applied;

FIG. 8 is a diagram illustrating position gaps in an x-axis direction in xy coordinates adjustable by parameters for exposure conditions;

FIG. 9 is a diagram illustrating position gaps in a y-axis direction in xy coordinates adjustable by parameters for exposure conditions;

FIG. 15 is a block diagram illustrating a hardware configuration of a position gap compensation unit according to an eighth embodiment;

DETAILED DESCRIPTION

According to one embodiment, an alignment method includes calculating a position gap of a predetermined point in a device area of a wafer based on a stress applied to the device area, and correcting an exposure condition in a lithography process of the device area based on the position gap of the predetermined point.

Exemplary embodiments of an alignment method, a pattern formation system, and an exposure device will be explained below in detail with reference to the accompanying drawings. The present invention is not limited to the following embodiments.

First Embodiment

Figure 1:
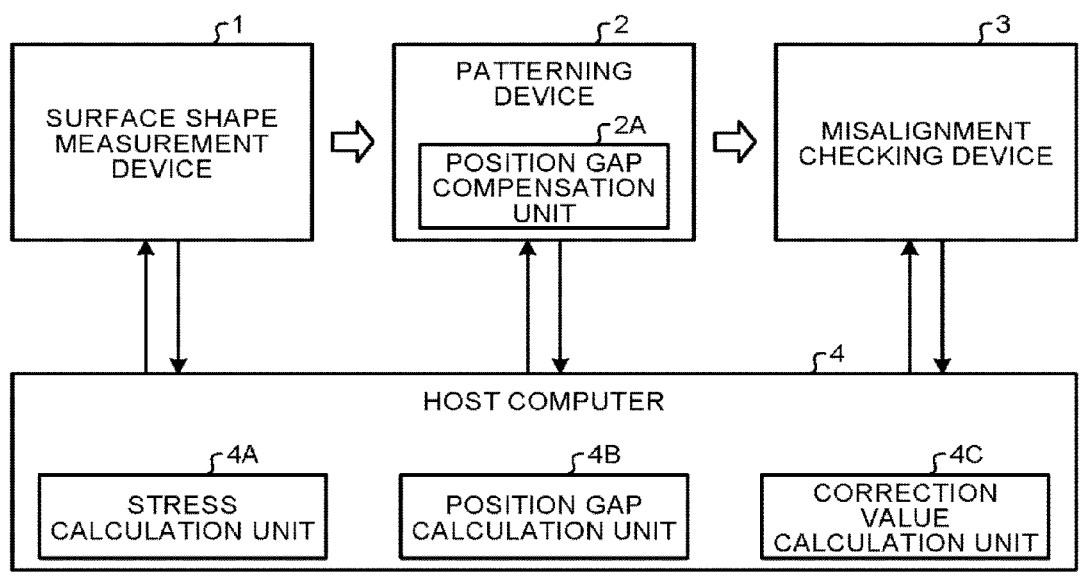
FIG. 1 is a schematic block diagram of a pattern formation system according to a first embodiment.

FIG. 1 is a schematic block diagram of a pattern formation system according to a first embodiment.

Referring to FIG. 1, the pattern formation system is provided with a surface shape measurement device 1, a patterning device 2, a misalignment checking device 3, and a host computer 4. The surface shape measurement device 1, the patterning device 2, and the misalignment checking device 3 are capable of data communications with the host computer 4. A wafer can be delivered from the surface shape measurement device 1 to the patterning device 2, and can be delivered from the patterning device 2 to the misalignment checking device 3. The patterning device 2 is provided with a position gap compensation unit 2A. The patterning device 2 may be an exposure device or a nanoimprint device. The host computer 4 is provided with a stress calculation unit 4A, a position gap calculation unit 4B, and a correction value calculation unit 4C.

The surface shape measurement device 1 measures the surface shape of a wafer on which devices are to be formed. The surface shape of the wafer may be height distribution on the surface of the wafer. Alternatively, the surface shape of the wafer may be nanotopography of the surface of the wafer. The surface shape may be measured through the use of shearing interferometry, Fizeau interferometry or Mach-Zehnder interferometry, or atomic force surface shape measuring method, or by a combination of the foregoing techniques, for example.

The material for the wafer may be a semiconductor such as Si. The device may be a memory, a logic circuit, a processor, or an analog circuit, for example. The memory may be a volatile semiconductor memory such as a DRAM or an SRAM, or a non-volatile semiconductor memory such as an NAND flash memory, an MRAM (magnetoresistive random access memory), a PCRAM (phase change random access memory), or a RRAM (resistance random access memory). In this example, an insulation film, a metal film, or a semiconductor film may be formed on the wafer. The insulation film may be formed of $SiO_2$, SiN, or the like, for example. The metal film may be formed of Al, Cu, W, or the like, for example. The semiconductor film may be formed of polysilicon, amorphous silicon, or the like. In addition, a device pattern may be formed on the wafer. The device pattern may be a wiring pattern, an electrode pattern, a hole pattern, a trench pattern, or a slit pattern, for example.

The patterning device 2 forms a pattern on the wafer in a device area. The misalignment checking device 3 checks a misalignment of superposition checking marks on the wafer. The stress calculation unit 4A calculates stress applied to the device area of the wafer based on the surface shape of the wafer. The position gap calculation unit 4B calculates position gaps of predetermined points in the device area of the wafer based on the stress applied to the device area. The predetermined points may be grid points set in a mesh form in the device area. However, when position gaps occur at spots without a device pattern at the alignment destination, the position gaps at the spots have no relationship with the accuracy of alignment with the device pattern at the alignment destination. Accordingly, the predetermined points may be set on the device pattern in the device area or may be set along the outline of the pattern in the device area. The correction value calculation unit 4C calculates correction values for control parameters in a patterning process of the device area, based on the position gaps of the predetermined points in the device area. The control parameters for the patterning device 2 are intended to, when the device pattern at the alignment destination is formed on the wafer, control the forming position, deformation, and distortion of a mask pattern for patterning a device pattern at the alignment source. The mask pattern may be a resist pattern at an exposure device or may be an imprint pattern at a nanoimprint device. The control parameters for the patterning device 2 can be corrected such that, when the positional relationship between the device pattern at the alignment destination and the device pattern at the alignment source on the wafer is defined by designed layout data, even though position gaps occur in the device pattern at the alignment destination, the control parameters for the patterning device 2 match the positional relationship in the designed layout data. The position gap compensation unit 2A sets control parameters for the patterning process of the device area, based on the correction values calculated by the correction value calculation unit 4C. The control parameters can be exposure conditions at an exposure device or can be pressing position of a template at an imprint device. For example, when position gaps occur in the device pattern at the alignment destination resulting from the stress applied to the device area of the wafer, the forming position of the mask pattern for transferring the device pattern at the alignment source can be corrected according to the position gaps. In addition, when deformation or distortion occurs in the device pattern at the alignment destination resulting from the stress applied to the device area of the wafer, deformation or distortion of the mask pattern for transferring the device pattern at the alignment source can be set according to the deformation or distortion.

When the device pattern at the alignment destination is formed on the wafer, the surface shape measurement device 1 measures the surface shape of the wafer and sends the results of measurement to the stress calculation unit 4A. The stress calculation unit 4A calculates the stress applied to the device area of the wafer based on the results of measurement from the surface shape measurement device 1, and sends the results of calculation to the position gap calculation unit 4B. The position gap calculation unit 4B calculates the position gaps of predetermined points in the device area based on the results of calculation from the stress calculation unit 4A, and sends the results of calculation to the correction value calculation unit 4C. The correction value calculation unit 4C calculates the control parameters for the patterning device 2 based on the results of calculation from the position gap calculation unit 4B and sends the results of calculation to the position gap compensation unit 2A. The position gap compensation unit 2A sets the control parameters for the patterning device 2 based on the correction values from the correction value calculation unit 4C.

The wafer having undergone surface shape measurement is delivered from the surface shape measurement device 1 to the patterning device 2. The patterning device 2 forms the mask pattern for transferring the device pattern at the alignment source on the wafer with the device pattern at the alignment destination, and delivers the wafer to the misalignment checking device 3. The misalignment checking device 3 checks the wafer for misalignment between the device pattern at the alignment destination and the mask pattern for transferring the device pattern at the alignment source. In this example, the misalignment can be checked by forming superposition checking marks together with the mask pattern on the wafer and observing the superposition checking marks.

As described above, in the first embodiment, the control parameters for the patterning device 2 can be set based on the position gaps resulting from the stress applied to the device area of the wafer. Accordingly, even when the stress applied to the device area increases with stacking of devices on the wafer and position gaps occur in the device pattern resulting from the stress, it is possible to improve the accuracy of alignment between the device patterns.

Second Embodiment

A second embodiment will be described below detail taking as an example the case in which a projection exposure device supporting a scan and repeat mode is used as the patterning device 2 illustrated in FIG. 1 to form a three-dimensional NAND flash memory on a wafer.

FIG. 2A is a planar view of an arrangement example of shot areas to which a pattern formation system according to a second embodiment is applied, FIG. 2B is a planar view of an arrangement example of chip areas in the shot area illustrated in FIG. 2A, and FIG. 2C is a planar view of an arrangement example of device areas arranged in the chip area illustrated in FIG. 2B.

Referring to FIG. 2A, shot areas SH are set on the wafer W. The shot areas SH can correspond to the projection range of a reticle used at the projection exposure device. In this example, a scan direction DS of the projection exposure device can be set such that all the shot areas SH on the wafer W are sequentially scanned.

As illustrated in FIG. 2B, chip areas RP are arranged in each of the shot areas SH. Alignment mark MA1 and superposition checking mark MP1 are arranged around each of the shot areas SH. Pluralities of alignment marks MA1 and superposition checking marks MP1 can be arranged around each of the shot area SH. In the example of FIG. 2B, six chip areas RP are arranged in each of the shot areas SH. However, any number of chip areas RP may be arranged in each of the shot areas SH.

As illustrate in FIG. 2C, a device area RV is provided in each of the chip areas RP. The device area RV includes a memory cell array area RA, a row decoder area LD, and a sense amplification area SA. In the memory cell array area RA, memory cells can be arranged three-dimensionally. Pad areas PD are provided around the device area RV.

FIG. 3A is a schematic perspective view of an exposure device applied to the pattern formation system illustrated in FIG. 1, and FIG. 3B is a planar view of an example of alignment marks detected in an alignment detection system illustrated in FIG. 3A.

Referring to FIG. 3A, the exposure device is provided with a light source 11 emitting exposure light LX, an illumination lens 12 irradiating a reticle 14 with the exposure light LX, a slit plate 13 shaping the exposure light LX in a slit form, a projection optical system 15 projecting the exposure light LX having passed through the reticle 14 onto the wafer W, and a stage 16 on which the wafer W is placed. The slit plate 13 is provided with a slit 13A. A chuck 17 sucking the wafer W is provided on the stage 16. A resist film R is applied to the wafer W. An alignment mark MA1 is formed on the wafer W before the application of the resist film R. An alignment mark MA2 is formed on the reticle 14. The stage 16 can be moved in x-axis, y-axis, and axis directions. The stage 16 can also be rotated in a θ1 direction and inclined in a θ2 direction or a θ3 direction. The projection optical system 15 can change the magnification ratio for a projection image onto the wafer W. The exposure light LX may be ultraviolet light, for example.

The exposure device is also provided with a reflection system 19 reflecting non-exposure light LN for observing the alignment marks MA1 and MA2 and an alignment detection system 20 detecting the alignment marks MA1 and MA2. The non-exposure light LN may be visible light or infrared light, for example.

The exposure device is further provided with an exposure control unit 18 that controls light exposure of the resist film R on the wafer W. The exposure control unit 18 includes an alignment unit 18A, a scan control unit 18B, and a position gap compensation unit 18C. The alignment unit 18A performs alignment between the reticle 14 and the shot area SH based on the detected positions of the alignment marks MA1 and MA2. The scan control unit 18B controls scans of the reticle 14 and the stage 16. In the scan and repeat mode, a scan SC1 of the reticle 14 and a scan SC2 of the stage 16 can be synchronized with each other. The position gap compensation unit 18C controls light exposure of the device area RV based on position gaps of predetermined points in the device area RV. In this example, a parameter for an exposure condition in the device area RV can be corrected based on the position gaps of the predetermined points in the device area RV. The exposure condition can be selected from at least one of the scan speed of the stage 16 relative to the reticle 14, the inclination of the stage 16 relative to the reticle 14, the rotational angle of the stage 16 relative to the reticle 14, and the magnification ratio of a projection image onto the wafer W.

FIG. 4A is a schematic block diagram of a misalignment checking device applied to the pattern formation system illustrated in FIG. 1, and FIG. 4B is a planar view of an example of position gap checking marks detected by an imaging element illustrated in FIG. 4A.

Referring to FIG. 4A, the misalignment checking device 3 is provided with a light source 31, an illumination lens 32, a half mirror 33, an objective lens 34, an image forming lens 35, an imaging element 36, an image processing device 37, an arithmetic processing device 38, and a stage 39. The light source 31 generates illumination light for illuminating the wafer W. The wavelength of the illumination light can be set in a visible range or an infrared range. The illumination lens 32 collects the illumination light emitted from the light source 31. The half mirror 33 reflects the illumination light emitted from the wafer W or lets through the reflection light from the wafer W. The objective lens 34 collects the illumination light on the wafer W. The image forming lens 35 collects the illumination light on an imaging surface of the imaging element 36. The imaging element 36 takes images of the superposition checking marks MP1 and MP2 on the wafer W. The imaging element 36 may be a CCD or a CMOS image sensor. The image processing device 37 processes the images taken by the imaging element 36. The arithmetic processing device 38 calculates the amount of a misalignment between the superposition checking marks MP1 and MP2 based on the images taken by the imaging element 36. The stage 39 can hold the wafer W. A resist film R is formed on the wafer W. The superposition checking marks MP1 are formed on the wafer W. The superposition checking marks MP2 are formed on the resist film R.

Figure 5:
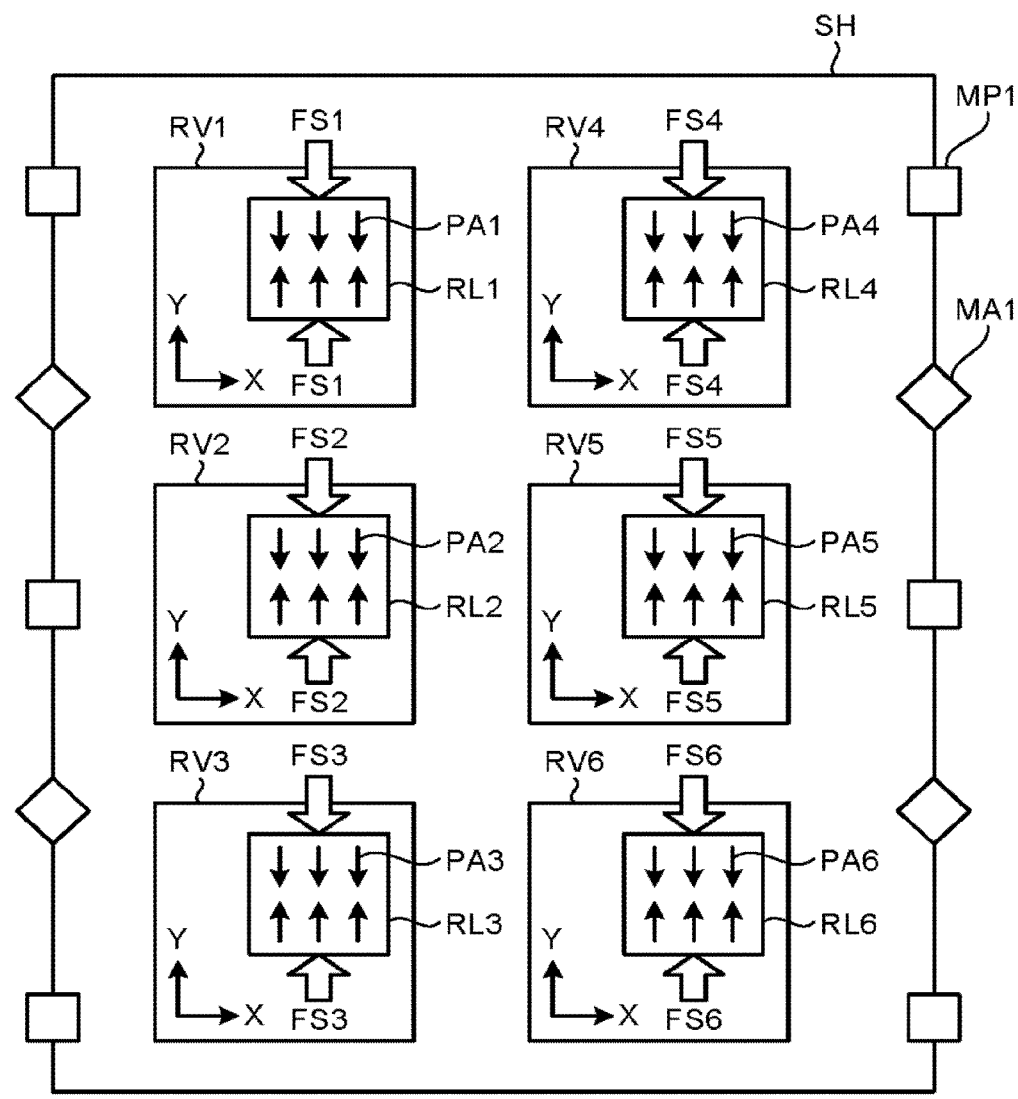
FIG. 5 is a planar view illustrating an example of relationships between stresses applied to the device areas and position gaps illustrated in FIG. 2C.

FIG. 5 is a planar view illustrating an example of relationships between stresses applied to the device areas and position gaps illustrated in FIG. 2C.

Referring to FIG. 5, device areas RV1 to RV6 are provided in each of the chip areas RP in the shot area SH. The device areas RV1 to RV6 include local areas RL1 to RL6 on which stresses FS1 to FS6 are focused, respectively. The local areas RL1 to RL6 can correspond to the memory cell array areas RA illustrated in FIG. 2C, for example. In the local areas RL1 to RL6, position gaps PA1 to PA6 occur resulting from the stresses FS1 to FS6, respectively. The local areas RL1 to RL6 can be limited to the ranges in which the stresses FS1 to FS6 causing the position gaps PA1 to PA6 equal to or larger than predetermined values, respectively.

FIGS. 6A-1, 6A-2, 6B-1, 6B-2, 7A-1, 7A-2, 7B-1, and 7B-2 are cross-sectional views illustrating a pattern formation method to which an alignment method implemented in the pattern formation system illustrated in FIG. 1 is applied. FIGS. 6A-1, 6B-1, 7A-1, and 7B-1 illustrate an example of devices formed in the memory cell array area RA illustrated in FIG. 2C. FIGS. 6A-2, 6B-2, 7A-2, and 7B-2 illustrate examples of devices formed in the row decoder area LD illustrated in FIG. 2C. In addition, FIGS. 6A-1, 6A-2, 6B-1, 6B-2, 7A-1, 7A-2, 7B-1, and 7B-2 illustrate an extract of the device area RV1 illustrated in FIG. 5.

Referring to FIG. 6A-1, a base layer 21 is formed on the wafer W. The base layer 21 may be the wafer W itself, an insulation layer, or a semiconductor layer. The base layer 21 may have a device pattern formed.

A stacked body SK is formed on the base layer 21 in the memory cell array area RA. The stacked body SK has insulation layers 22 and 23 of different materials alternately stacked. For example, the insulation layers 22 may be silicon oxide films, and the insulation layers 23 may be silicon nitride films. The stacked body SK has a memory hole 29. A columnar body 30 is embedded in the memory hole 29. The columnar body 30 can have a memory film storing data along the inner periphery of the memory hole 29. The columnar body 30 can be the device pattern at the alignment destination.

Figures 1, 7A:
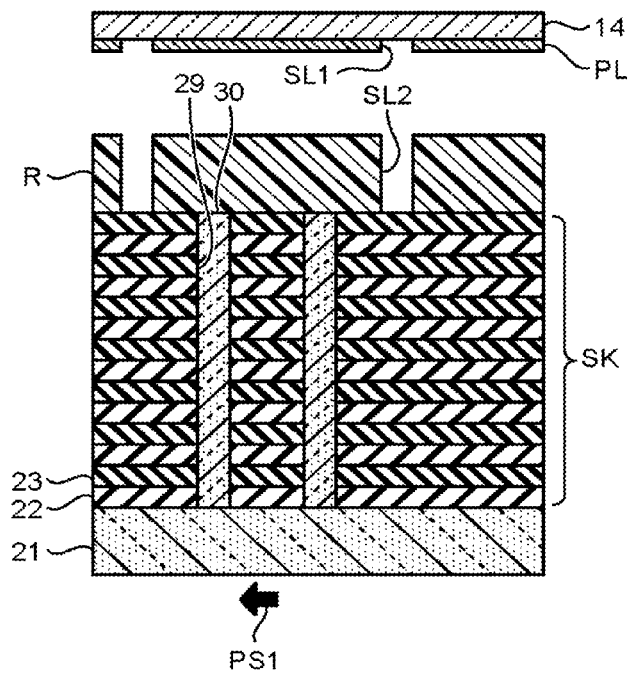
Figures 2, 7A:
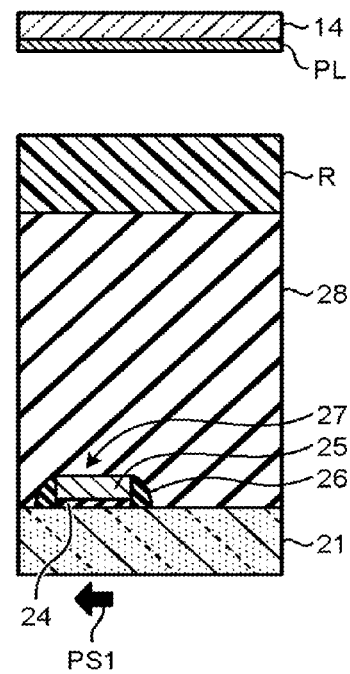

Referring to FIG. 6A-2, a transistor 27 is formed on the base layer 21 in the row decoder area LD. The transistor 27 can be provided with a gate insulation film 24, a gate electrode 25, and side walls 26. An inter-layer insulation film 28 is formed on the transistor 27. The material for the inter-layer insulation film 28 may be a silicon oxide film, for example.

The surface shape of the wafer W in this state is measured by a surface shape measurement device 1. By the measurement of the surface shape, it is possible to determine the distribution of a height HL1 of the memory cell array area RA and the distribution of a height HL2 of the row decoder area LD.

Next, as illustrated in FIGS. 6B-1 and 6B-2, a resist film R is applied to the stacked body SK and the inter-layer insulation film 28. The surface shape of the wafer W in this state is measured by the surface shape measurement device 1. By the measurement of the surface shape, it is possible to determine the distribution of a height HU1 of the memory cell array area RA and the distribution of a height HU2 of the row decoder area LU. At that time, the stacked body SK is subjected to the stress FS1 and the position gap PA1 occurs in the columnar body 30.

The results of determination on the distributions of the heights HL1, HL2, HU1, and HU2 of the wafer W are sent to the stress calculation unit 4A illustrated in FIG. 1. The stress calculation unit 4A calculates the distribution of the stress FS1 applied to the stacked body SK based on the distributions of the heights HL1, HL2, HU1, and HU2 at that time. The stress FS1 can be calculated by use of the difference between the heights HL1, HL2 and the heights HU1, HU2. The position gap calculation unit 4B calculates the distribution of the position gap PA1 of the columnar body 30 based on the distribution of the stress FS1 calculated by the stress calculation unit 4A. The correction value calculation unit 4C calculates the correction values for exposure conditions based on the distribution of the position gap PA1 of the columnar body 30. The correction values for exposure conditions can be set such that the positional relationship between the columnar body 30 and the slit pattern SL3 matches the designed layout data even with the position gap PA1 of the columnar body 30. By changing the exposure conditions, it is possible to change the scan speed of the stage 16 relative to the reticle 14, the inclination of the stage 16 relative to the reticle 14, the rotation angle of the stage 16 relative to the reticle 14, and the magnification ratio of a projection image onto the wafer W.

Next, the wafer W with the resist film R applied is delivered to the exposure device illustrated in FIG. 3A. The chuck 17 sucks the wafer W to fix the wafer W onto the chuck 17. Then, the non-exposure light LN is applied to the alignment marks MA1 and MA2. The non-exposure light LN enters the alignment detection system 20 via the reflection system 19. At that time, as illustrated in FIG. 3B, mark images MB1 and MB2 corresponding to the alignment marks MA1 and MA2, respectively, are created on a detection surface 20A of the alignment detection system 20, and are sent to the alignment unit 18A. The alignment unit 18A adjusts the position of the stage 16 such that the mark images MB1 and MB2 are superposed, thereby performing an alignment between the reticle 14 and the shot area SH.

Next, the light source 11 emits the exposure light LX. The exposure light LX is converted into parallel light at the illumination lens 12, guided to the slit plate 13, and shaped in a slit form by the slit plate 13. The exposure light LX shaped in a slit form enters the reticle 14. The exposure light LX having passed through the reticle 14 is projected onto the wafer W by the projection optical system 15 to expose the resist film R to the light. In the scan and repeat mode, while the exposure light LX is projected onto the wafer W, the reticle 14 and the stage 16 are scanned in synchronization along the scan direction DS of FIG. 2A. The position gap compensation unit 18C controls the exposure conditions for the resist film R based on the correction values calculated by the correction value calculation unit 40.

In this example, as illustrated in FIGS. 7A-1 and 7A-2, a light-shielding film PL is formed on the reticle 14 and a slit pattern SL1 is formed on the light-shielding film PL. In addition, the position of the slit pattern SL3 relative to the columnar body 30 is defined by the designed layout data. A shift amount PS1 of the stage 16 relative to the reticle 14 can be set to cancel out the position gap PA1 of the columnar body 30. The exposure light LX can be projected onto the wafer W with the movement of the stage 16 by the shift amount PS1 to expose the resist film R to the light.

Next, after the light exposure of the resist film R, the resist film R is developed to form a slit pattern SL2 corresponding to the slit pattern SL1 of the reticle 14 on the resist film R. The slit pattern SL2 can be a mask pattern for transferring the device pattern at the alignment source.

The wafer W with the slit pattern SL2 formed on the resist film R is delivered to the misalignment checking device 3 illustrated in FIG. 4A and placed on the stage 39. Prior to the delivery to the misalignment checking device 3, the superposition checking marks MP1 are formed on the wafer W and the superposition checking marks MP2 are formed on the resist film R.

Then, the light source 31 emits illumination light that is collected by the illumination lens 32. The illumination light enters the objective lens 34 via the half mirror 33 and is collected on the wafer W. The illumination light having entered the superposition checking marks MP1 and MP2 is reflected by the superposition checking marks MP1 and MP2. When the superposition checking marks MP1 and MP2 are different in height, the stage 39 may be vertically moved to the focus position of the objective lens 34. The reflection light from the superposition checking marks MP1 and MP2 enters the imaging element 36 via the objective lens 34, the half mirror 33, and the image forming lens 35. At that time, mark images MQ1 and MQ2 corresponding to the superposition checking marks MP1 and MP2, respectively, are created on an imaging surface 36A of the imaging element 36, and are sent to the image processing device 37. The image processing device 37 extracts edges of the mark images MQ1 and MQ2. Then, the arithmetic processing device 38 calculates a misalignment between the superposition checking marks MP1 and MP2 based on the edge positions of the mark images MQ1 and MQ2. When the misalignment falls within a range of the specification, the wafer W with the slit pattern SL2 formed on the resist film R is delivered to an etching device.

Figures 1, 7B:
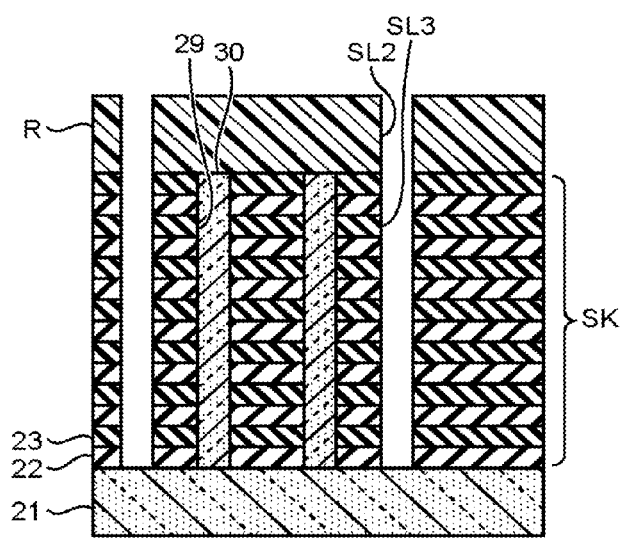
Figures 2, 7B:
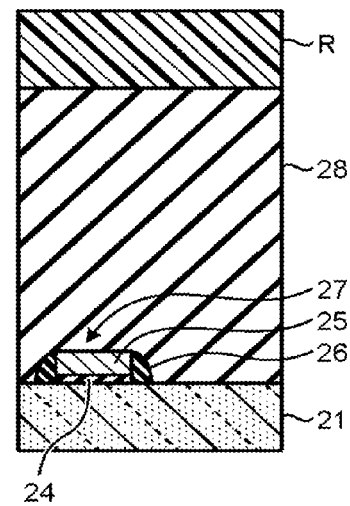

As illustrated in FIGS. 7B-1 and 7B-2, the stacked body SK is etched with the resist film R having the slit pattern SL2 as a mask to form a slit pattern SL3 on the stacked body SK. The slit pattern SL3 can be the device pattern at the alignment source.

In the second embodiment described above, the shift amount PS1 of the stage 16 is set to cancel out the position gap PA1 of the columnar body 30 resulting from the stress FS1 applied to the stacked body SK. Accordingly, even when the stress FS1 applied to the stacked body SK increases with larger stacks in the stacked body SK and the position gap PA1 of the columnar body 30 resulting from the stress FS1 occurs, the accuracy of alignment between the columnar body 30 and the slit pattern SL3 can be improved.

In contrast, when the misalignment between the superposition checking marks MP1 and MP2 does not fall within the range of the specification, the information on the amount of the misalignment sent to the host computer 4. Then, the parameters for exposure conditions at the exposure device illustrated in FIG. 3A can be re-set to reduce the amount of the misalignment. In addition, the resist film R illustrated in FIGS. 7A-1 and 7A-2 can be removed and a new resist film R can be formed as illustrated in FIGS. 6B-1 and 6B-2. After the steps illustrated in FIGS. 7A-1 and 7A-2, misalignment checking can be performed by the misalignment checking device 3 illustrated in FIG. 4A. The resist film R can be repeatedly re-formed until it passes the misalignment checking. At the time of passing the misalignment checking, the process can move to the etching step. At the etching step, the slit pattern SL3 is formed on the stacked body SK.

Next, the insulation layers 23 are selectively etched via the slit pattern SL3 to remove the insulation layers 23 while leaving the insulation layers 22. Then, conductors such as W or amorphous silicon are embedded into the portions from which the insulation layers 23 are removed to form word lines between the insulation layers 22.

The parameters for exposure conditions at the exposure device may be set for each of the shot areas SH illustrated in FIG. 5, or may be set for each of the device areas RV1 to RV6, or may be set for each of the local areas RL1 to RL6. When the parameters for exposure conditions are fixedly set for each of the shot areas SH, the parameters can also be applied to a projection exposure device supporting the scan and repeat mode. At the projection exposure device supporting the scan and repeat mode, the parameters for exposure conditions may be changed according to the scan position of the stage 16.

The method for setting the parameters for exposure conditions with variations in magnitude and direction of position gaps at setting points of the shot areas SH will be described below with the use of equations.

To set the parameters for exposure conditions at the exposure device for each of the shot areas SH illustrated in FIG. 5, xy coordinates can be set for each of the shot areas SH such that a position gap amount dx in the x-axis direction and a position gap amount dy in the y-axis direction are given by xy coordinate orthogonal functions with the parameters for exposure conditions as coefficients.

The position gap amounts dx and dy can be given by the following equations (1) and (2) using the xy coordinate orthogonal functions:

$$dx = k_1 + k_3 x + k_5 y + k_7 x^2 + k_9 xy + k_{11} y^2 + k_{13} x^3 + k_{15} x^2 y + k_{17} xy^2 + k_{19} y^3 \quad (1)$$

$$dy = k_2 + k_4 y + k_6 x + k_8 y^2 + k_{10} xy + k_{12} x^2 + k_{14} y^3 + k_{16} xy^2 + k_{18} x^2 y + k_{20} x^3 \quad (2)$$

The position gap amounts dx and dy calculated at the respective setting points in the xy coordinates of the shot areas SH are substituted in the equations (1) and (2), and the simultaneous equations are solved to calculate parameters $k_1$ to $k_{20}$. The number of the setting points in the xy coordinates of the shot areas SH can be about several hundreds. When the number of the setting points in the xy coordinates of the shot areas SH is too large, it is not possible to calculate the parameters $k_1$ to $k_{20}$ matching the positional gap amounts dx and dy at all the setting points. In this case, the parameters $k_1$ to $k_{20}$ can be calculated for each of the shot areas SH such that the fitting residuals in the equations (1) and (2) become the minimum.

To change the parameters $k_1$ to $k_{20}$ according to the scan position of the stage 16, the position gap amounts dx and dy calculated at the setting point of each scan position are substituted in the equations (1) and (2), and the simultaneous equations are solved to calculate the parameters $k_1$ to $k_{20}$ at each of the scan positions. In the equations (1) and (2), the position gap amounts dx and dy are expressed by xy coordinate orthogonal functions, but may be expressed by polar coordinate orthogonal functions instead.

FIG. 8 is a diagram illustrating position gaps in the x-axis direction in the xy coordinates adjustable by parameters for exposure conditions.

Referring to FIG. 8, $k_1$ denotes a shift element in the x-axis direction, $k_3$ a magnification element in the x-axis direction, $k_5$ a rotation element in the x-axis direction (or an orthogonality element in the x-axis direction), $k_7$ an eccentric magnification element in the x-axis direction, $k_9$ a trapezoid element in the x-axis direction, $k_{11}$ an arch element in the x-axis direction, $k_{13}$ a tertiary magnification element in the x-axis direction, $k_{15}$ an accordion element in the x-axis direction, $k_{17}$ barrel shape element in the x-axis direction, and $k_{19}$ a river current element in the x-axis direction.

FIG. 9 is a diagram illustrating position gaps in the y-axis direction in xy coordinates adjustable by parameters for exposure conditions.

Referring to FIG. 9, $k_2$ denotes a shift element in the y-axis direction, $k_4$ a magnification element in the y-axis direction, $k_6$ a rotation element in the y-axis direction (or an orthogonality element in the y-axis direction), $k_8$ an eccentric magnification element in the y-axis direction, $k_{10}$ a trapezoid element in the y-axis direction, $k_{12}$ an arch element in the y-axis direction, $k_{14}$ a tertiary magnification element in the y-axis direction, $k_{16}$ an accordion element in the y-axis direction, $k_{18}$ a barrel shape element in the y-axis direction, and $k_{20}$ a river current element in the y-axis direction.

These parameters $k_1$ to $k_{20}$ can be changed to alter the scan speed of the stage 16 relative to the reticle 14, the inclination of the stage 16 relative to the reticle 14, the rotation angle of the stage 16 relative to the reticle 14, the magnification ratio of a projection image onto the wafer W, and the like.

The parameters $k_1$ to $k_2$ can be converted into correction values for correction at the exposure device. For example, the correction values for correction at the exposure device include shifts ShiftX and ShiftY, shot magnifications ShotmagX and ShotmagY, shot rotations ShotrotY and ShotrotX, symmetrical magnification Symmag, asymmetrical magnification Asymmag, symmetrical rotation Symrot, and asymmetrical rotation Asymrot, for example.

The relationships between these correction values and the parameters $k_1$ to $k_{20}$ can be expressed by the following equations:

ShiftX=$k_1$

ShiftY=$k_2$

ShotmagX=$k_3$
ShotmagY=$k_4$
ShotrotY=$-k_5$
ShotrotX=$k_6$
Symmag=$(k_3+k_4)/2$
Asymmag=$(k_3-k_4)/2$
Symrot=$(-k_5+k_6)/2$
Asymrot=$(-k_5-k_6)/2$ To set the parameters for exposure conditions at the exposure device for each of the local areas RL1 to RL6 illustrated in FIG. 5, the XY coordinates can be set for each of the local areas RL1 to RL6 such that the position gap amount dX in the X-axis direction and the position gap amount dY in the Y-axis direction are given by the XY coordinate orthogonal functions with the parameters for exposure conditions as coefficients.

The position gap amounts dX and dY can be given by the following equations (3) and (4) using XY coordinate orthogonal functions:

$$dX=K_1+K_3X+K_5Y+K_7X^2+K_9XY+K_{11}Y^2+K_{13}X^3+K_{15}X^2Y+K_{17}XY^2+K_{19}Y^3 \quad (3)$$

$$dY=K_2K_4Y+K_6X+K_8Y^2+K_{10}XY+K_{12}X^2+K_{14}Y^3+K_{16}XY^2+K_{18}X^2Y+K_{20}X^3 \quad (4)$$

The parameters $K_1$ to $K_{20}$ can correspond to parameters $k_1$ to $k_{20}$, respectively. The misalignment amounts dX and dY calculated at the setting points in the XY coordinates in the local areas RL1 to RL6 are substituted in the equations (3) and (4), and the simultaneous equations at that time are solved to calculate the parameters $K_1$ to $K_{20}$. The number of the setting points in the XY coordinates of the local areas RL1 to RL6 can be about several hundreds. When the number of the setting points in the XY coordinates of the local areas RL1 to RL6 is too large, it is not possible to calculate the parameters $k_1$ to $k_{20}$ matching the positional gap amounts dX and dY at all the setting points. In this case, the parameters $k_1$ to $k_{20}$ can be calculated for each of the local areas RL1 to RL6 such that the fitting residuals in the equations (3) and (4) become the minimum.

To change the parameters $K_1$ to $K_{20}$ according to the scan position of the stage 16, the position gap amounts dX and dY calculated at the setting point of each scan position are substituted in the equations (3) and (4), and the simultaneous equations are solved to calculate the parameters $K_1$ to $K_{20}$ at each of the scan positions. In the equations (3) and (4), the position gap amounts dX and dY are expressed by XY coordinate orthogonal functions, but may be expressed by polar coordinate orthogonal functions instead.

In this example, by correcting the exposure conditions in the lithography process based on the position gap amounts resulting from the stresses applied to the device areas of the wafer, it is possible to improve the accuracy of alignment between the device patterns even when there occur position gaps in the device patterns resulting from the stresses applied to the device areas of the wafer.

Third Embodiment

In the second embodiment described above, the position gaps in the alignment marks MA1 and the superposition checking marks MP1 due to the stresses FS1 to FS6 are not reflected to correct the position gaps PA1 to PA6 in the device patterns due to the stresses FS1 to FS6. In a third embodiment, the position gaps in the alignment marks MA1 and the superposition checking marks MP1 due to the stresses FS1 to FS6 may be reflected to correct the position gaps PA1 to PA6 in the device patterns due to the stresses FS1 to FS6.

Figure 10:
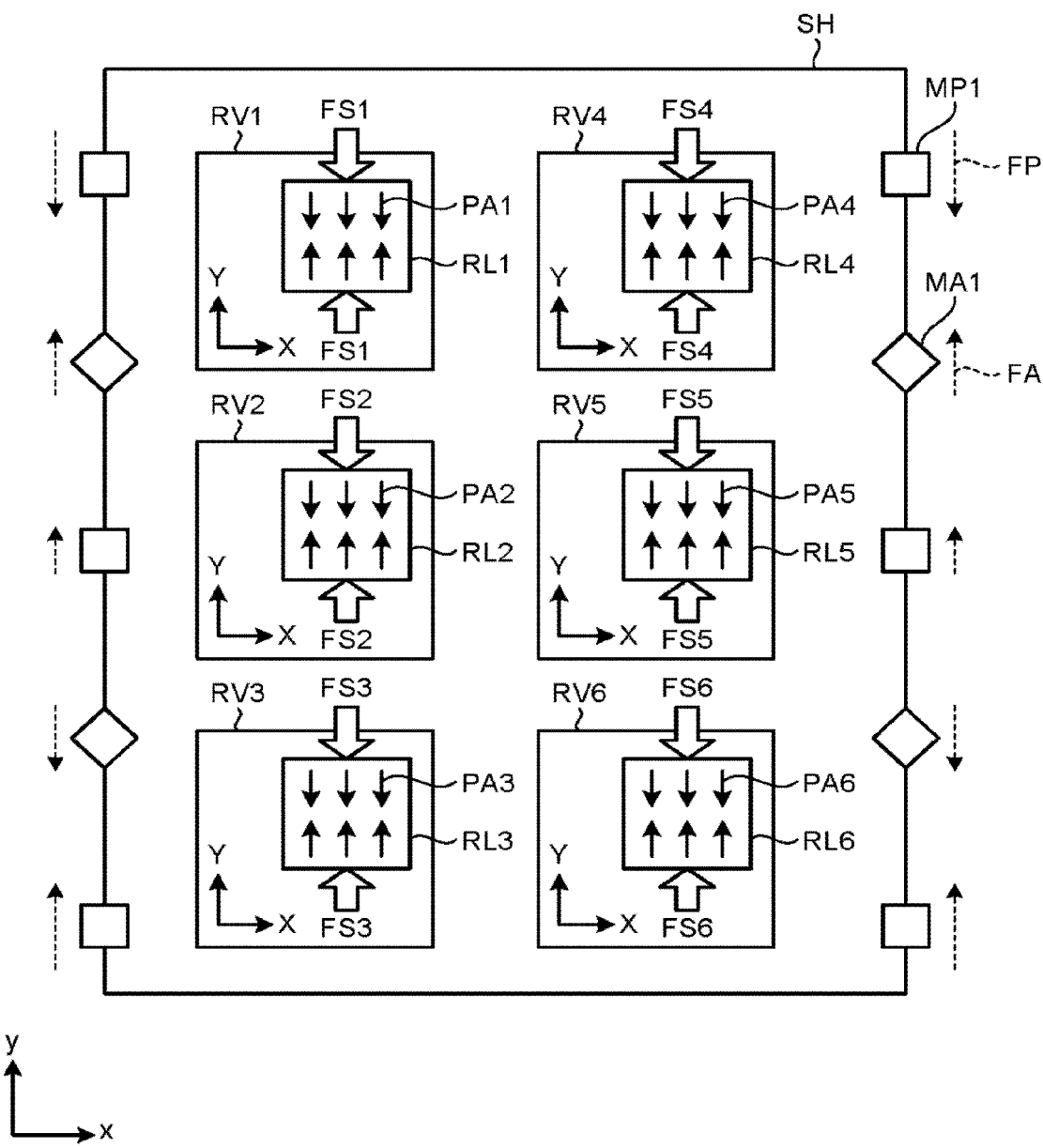
FIG. 10 is a planar view illustrating an example of relationships between stresses and position gaps in the shot areas illustrated in an alignment method according to a third embodiment.

FIG. 10 is a planar view illustrating an example of relationships between stresses and position gaps in the shot areas illustrated in an alignment method according to a third embodiment.

Referring to FIG. 10, a position gap FA in the alignment mark MA1 and a position gap FP in the superposition checking mark MP1 occur resulting from the stresses FS1 to FS6 generated in the device areas RV1 to RV6.

At that time, the position gap calculation unit 4B illustrated in FIG. 1 calculates the position gaps of predetermined points in the device areas based on the results of calculation from the stress calculation unit 4A, and also calculates a position gap FA of the alignment mark MA1 and a position gap FP of the superposition checking mark MP1, and then sends the results of calculation to the position gap compensation unit 18C illustrated in FIG. 3. The position gap compensation unit 18C sets the parameters for exposure conditions at the exposure device such that the position gaps PA1 to PA6 calculated by the position gap calculation unit 4B are compensated for. The parameters for exposure conditions can be set such that the position gap FA of the alignment mark MA1 and the position gap FP of the superposition checking mark MP1 can be canceled out.

By correcting the exposure conditions for the lithography process based on not only the position gaps resulting from the stresses applied to the device areas of the wafer but also the position gap of the alignment mark and the position gap of the superposition checking mark, it is possible to further improve the accuracy of alignment between the device patterns. When a plurality of alignment marks MA1 and a plurality of superposition checking marks MP1 are provided in each of the shot areas SH, the alignment mark MA1 and the superposition checking mark MP1 closest to each of the device areas RV1 to RV6 can be selected for each of the device areas RV1 to RV6.

Fourth Embodiment

Figure 11:
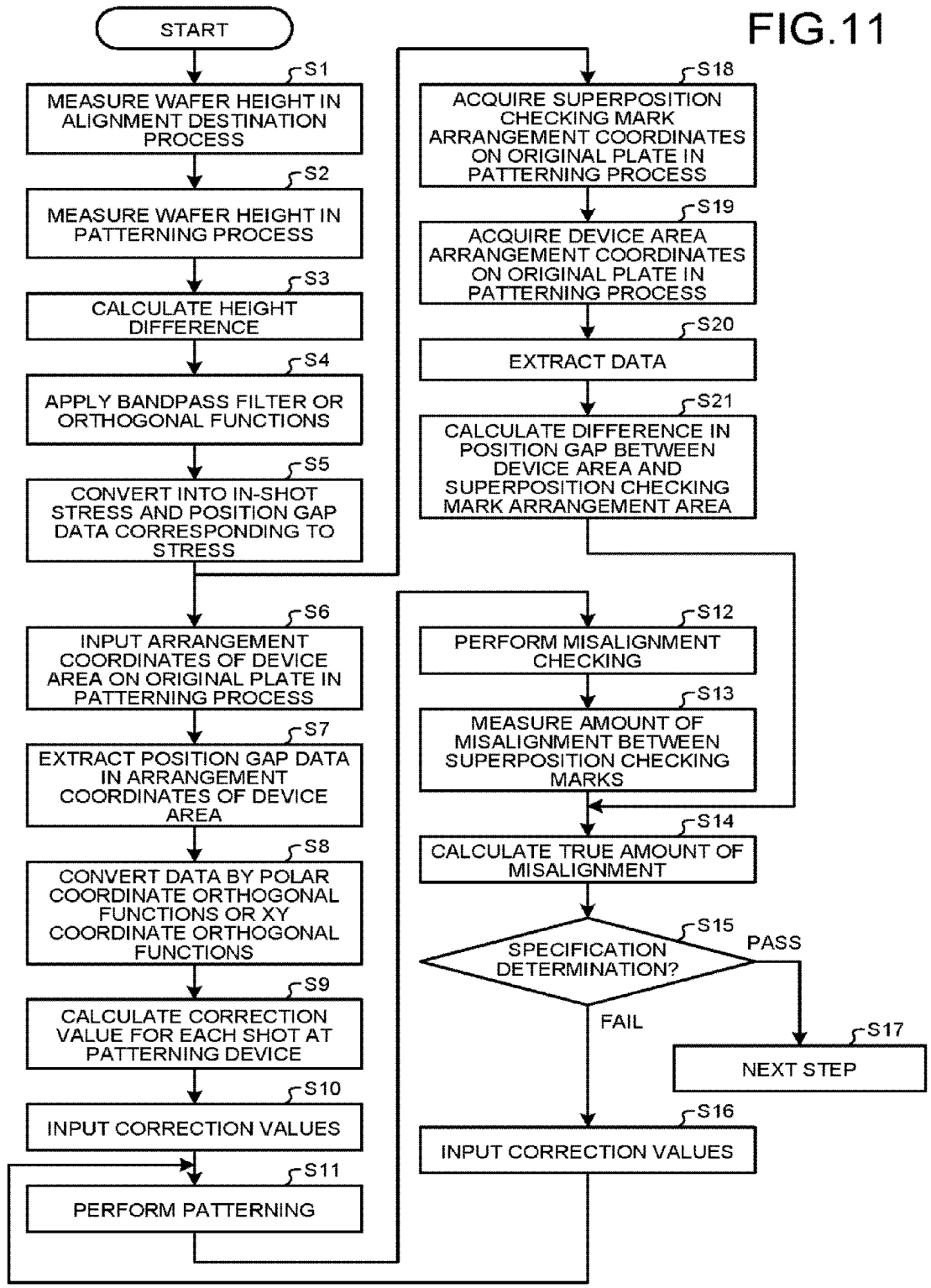
FIG. 11 is a flowchart of an alignment method according to a fourth embodiment.

FIG. 11 is a flowchart of an alignment method according to a fourth embodiment.

Referring to FIG. 11, the height of the wafer in the alignment destination process is measured by the surface shape measurement device 1 illustrated in FIG. 1 (S1). The alignment destination process refers to the device pattern formation process at the alignment destination. The alignment destination process corresponds to the steps illustrated in FIGS. 6A-1 and 6A-2, for example.

Then, the height of the wafer in the patterning process is measured by the surface shape measurement device 1 illustrated in FIG. 1 (S2). The patterning process refers to the process for forming a mask pattern for transferring the device pattern at the alignment source. For example, the patterning process refers to the resist pattern formation process when the patterning device 2 illustrated in FIG. 1 is an exposure device, and the patterning process refers to the imprint pattern formation process when the patterning device 2 illustrated in FIG. 1 is a nanoimprint device. The patterning process at the exposure device corresponds to the steps illustrated in FIGS. 6B-1, 6B-2, 7A-1, and 7A-2, for example.

Next, differential data between the height wafer in the alignment destination process and the height of the wafer in the patterning process is calculated (S3). The stress calculation unit 4A and the position gap calculation unit 4B illustrated in FIG. 1 apply a bandpass filter to the differential data having undergone frequency analysis in wafer-surface coordinates or apply XY coordinate orthogonal functions or polar coordinate orthogonal functions to the differential data (S4) to convert the differential data into in-shot stresses and position gap data corresponding to the stresses (S5). For this conversion, product information, device area information, lot information, and wafer information can be referred to. The product information can indicate for which products the chips in the chip areas RP illustrated in FIG. 2B are to be used. The device area information can indicate shot sizes and reticle names. The lot information can indicate which film formation devices or which chambers are to be used for film formation on the wafer W. The wafer information can indicate to which chambers the wafers in each lot are to be directed.

Next, the device area arrangement coordinates on an original plate in the patterning process are input into the correction value calculation unit 4C illustrated in FIG. 1 (S6). The original plate can correspond to a reticle at the exposure device, and correspond to a template at the imprint device. The correction value calculation unit 4C applies the position gap data calculated at S5 to the arrangement coordinates prepared at S6 to extract position gap data in the device area arrangement coordinates (S7). The correction value calculation unit 4C converts the position gap data extracted at S7 by the use of the XY coordinate orthogonal functions or the polar coordinate orthogonal functions (S8) to calculate the correction values for each shot at the patterning device 2 (S9). The correction values for each shot can be calculated at the exposure device using the equations (1) and (2).

Next, the correction values calculated at S9 are input into the position gap compensation unit 2A illustrated in FIG. 1 (S10). The position gap compensation unit 2A sets control parameters for the patterning device 2 based on the correction values. The wafer having undergone surface shape measurement is delivered from the surface shape measurement device 1 to the patterning device 2 for patterning of the wafer (S11). The patterned wafer is delivered from the patterning device 2 to the misalignment checking device 3 for misalignment checking (S12). At that time, the amount of misalignment between the superposition checking mark formed on the wafer before the patterning and the superposition checking mark formed on the wafer after the patterning is measured and input into the position gap calculation unit 45 (S13). The superposition checking marks may be box-in-box patterns, bar-in-bar patterns, AIM patterns, scattered light measurement mark patterns, for example. The superposition checking marks may be changed lot by lot, wafer by wafer, or shot by shot. In this example, the superposition checking marks with stress distributions close to the tendency of the stress distribution of the device area can be selected.

Meanwhile, when inputting the device area arrangement coordinates on the original plate in the patterning process into the correction value calculation unit 4C illustrated in FIG. 1 (S6), the position gap calculation unit 4B acquires the superposition checking mark arrangement coordinates on the original plate in the patterning process (S18). The position gap calculation unit 4B also acquires the device area arrangement coordinates on the original plate in the patterning process (S19). The position gap calculation unit 4B then extracts data from these arrangement coordinates (S20), and calculates a difference in position gap between the device area and the superposition checking mark arrangement area (S21). The position gap calculation unit 4B then adds the position gap difference calculated at S21 to the amount of misalignment measured at S13 to calculate the true amount of misalignment (S14). The position gap calculation unit 4B then determines whether the true amount of misalignment falls within a range of the specification (S15). When the true amount of misalignment does not fall within the range of the specification, the position gap calculation unit 4B inputs the true amount of misalignment into the correction value calculation unit 4C. The correction value calculation unit 4C calculates again the correction values for each shot at the patterning device 2 such that the true amount of misalignment is canceled out, and inputs the correction values to the position gap compensation unit 2A (S16). The position gap compensation unit 2A re-sets the control parameters for the patterning device 2 based on the correction values. The resist is re-applied to the wafer, and then the wafer is delivered to the patterning device 2 for patterning (S11). In contrast, when it is determined that the true amount of misalignment falls within the range of the specification in S15, the process moves to the next step (S17).

Fifth Embodiment

Figure 12:
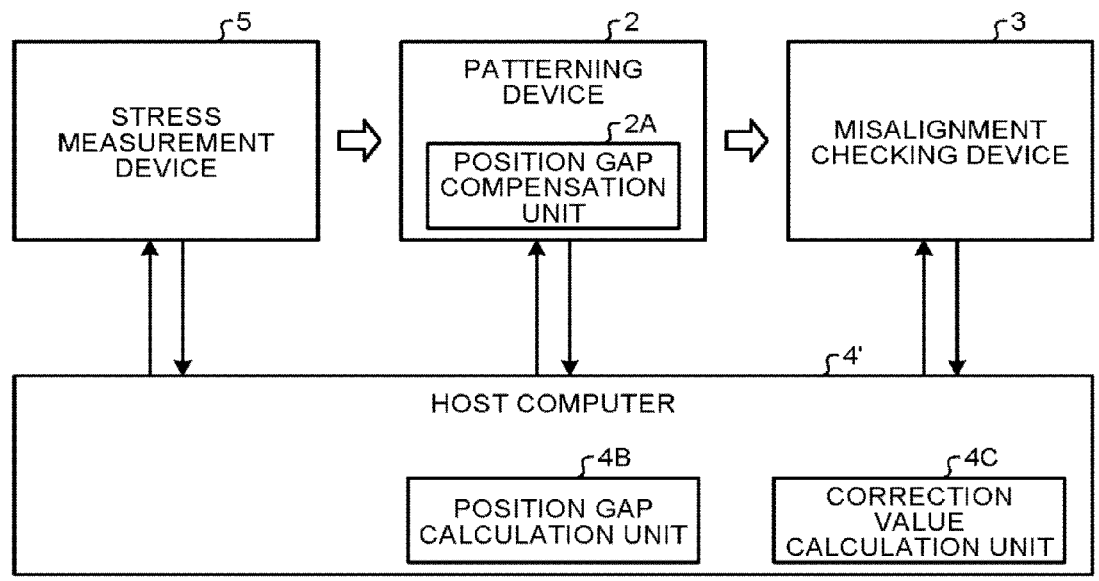
FIG. 12 is a schematic block diagram of a pattern formation system according to a fifth embodiment.

FIG. 12 is a schematic block diagram of a pattern formation system according to a fifth embodiment.

Referring to FIG. 12, the pattern formation system is provided with a stress measurement device 5 and a host computer 4' instead of the surface shape measurement device 1 and the host computer 4 illustrated in FIG. 1. The stress measurement device 5, the patterning device 2, and the misalignment checking device 3 are capable of data communications with the host computer 4'. The host computer 4' is provided with the position gap calculation unit 4B and the correction value calculation unit 4C.

The stress measurement device 5 measures the stresses applied to the device areas of the wafer. The stress may be measured by X-ray stress measuring method, convergent beam electron diffraction method, microscopic laser Raman spectroscopy, or a combination of these methods, for example.

When the device pattern at the alignment destination is formed on the wafer, the stress measurement device 5 measures the stresses applied to the device areas of the wafer, and sends the results of measurement to the position gap calculation unit 4B. The position gap calculation unit 4B calculates position gaps of predetermined points in the device areas based on the results of measurement from the stress measurement device 5, and sends the results of calculation to the correction value calculation unit 4C. The correction value calculation unit 4C calculates the correction values for exposure control in the lithography process in the device areas based on the results of calculation from the position gap calculation unit 4B, and sends the same to the position gap compensation unit 2A. The correction values can be set such that the calculated position gaps from the correction value calculation unit 4C are compensated for. The position gap compensation unit 2A sets the control parameters for alignment at the patterning device 2 based on the correction values from the correction value calculation unit 4C.

The wafer having undergone stress measurement is delivered from the stress measurement device 5 to the patterning device 2. The patterning device 2 forms a mask pattern for transferring the device pattern at the alignment source onto the wafer with the device pattern at the alignment destination, and delivers the wafer to the misalignment checking device 3. The misalignment checking device 3 checks for misalignment between the superposition checking mark formed on the wafer together with the device pattern at the alignment destination and the superposition checking mark formed on the wafer together with the mask pattern for transferring the device pattern at the alignment source.

By setting the control parameters for alignment at the patterning device 2 based on the position gaps resulting from the stresses applied to the device areas of the wafer, the accuracy of alignment between the device patterns can be improved even when there occurs position gaps in the device patterns resulting from the stresses applied to the device areas of the wafer.

Sixth Embodiment

Figure 13A:
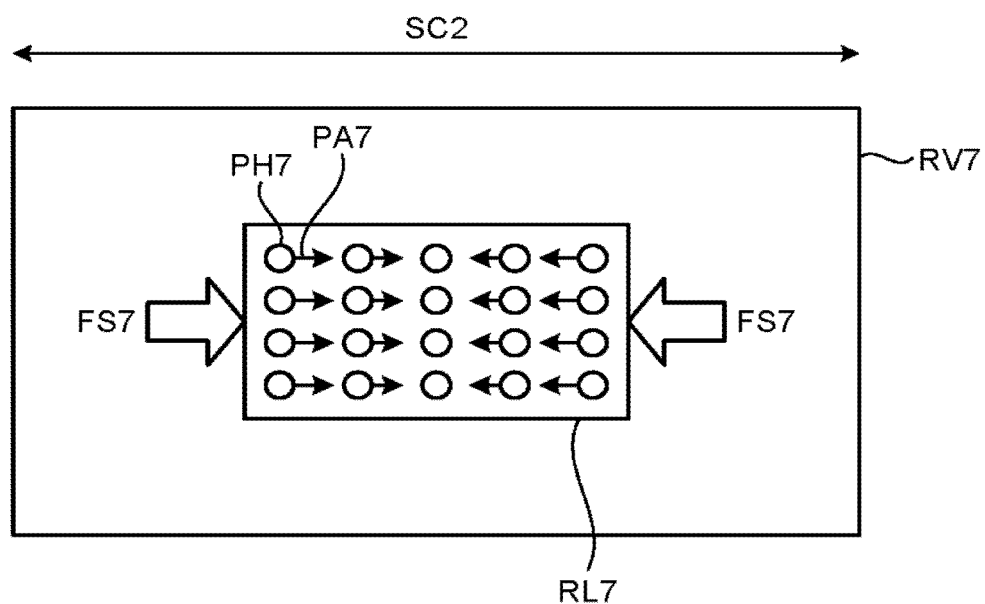
FIG. 13A is a planar view illustrating an example of relationship between stresses and position gaps in a device area to which an alignment method according to a sixth embodiment is applied.
Figure 13B:
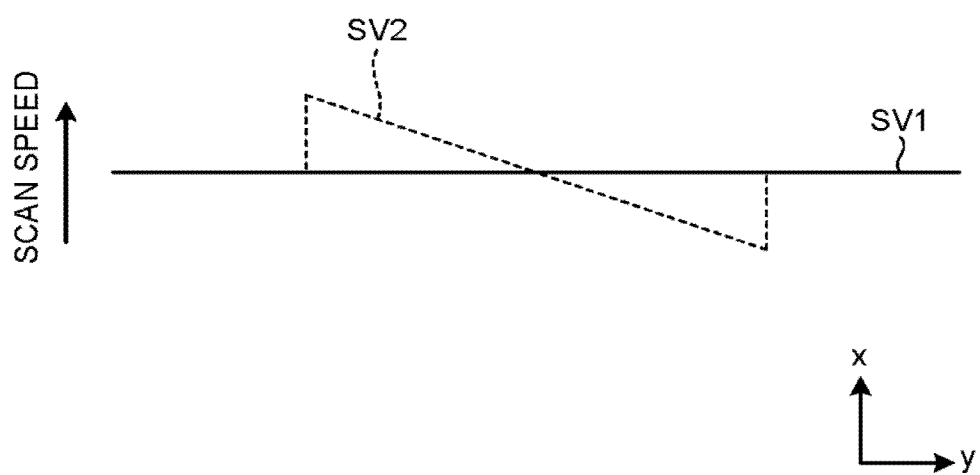
FIG. 13B is a diagram illustrating a controlling method of a wafer stage at the time of scanning with exposure light.

FIG. 13A is a planar view illustrating an example of a relationship between stress and position gap in a device area to which an alignment method according to a sixth embodiment is applied, and FIG. 13B is a diagram illustrating a controlling method of a wafer stage at the time of scanning with exposure light.

Referring to FIG. 13A, the wafer W is provided with a device area RV7. The device area RV7 has a local area RL7 on which a stress FS7 is focused. In the local area RL7, position gaps PA7 of device patterns PH7 result from the stress FS7. FIG. 13A illustrates the case where the device patterns PH7 are hole patterns. The position gaps PA7 occur in the y-axis direction, and the magnitude and direction of the position gaps PA7 vary depending on the position of the local area RL7.

As illustrated in FIG. 13B, to control the alignment of resist patterns formed on the device patterns PH7, a scan speed SV2 of the stage 16 can be changed while keeping constant a scan speed SV1 of the reticle 14 according to the position gaps PA7. By changing the scan speed SV2 of the stage 16 relative to the reticle 14, the amount of shifts of the resist patterns formed on the device patterns PH7 can be changed. The resist patterns formed on the device patterns PH7 can be shifted by changing the parameter $k_2$ in the equation (2) or the parameter $K_2$ in the equation (4) according to the scan position.

By changing the scan speed SV2 according to the scan position, it is possible to align the resist patterns corresponding to the position gaps PA7 of the device patterns even when the position gaps PA7 in the local area RL7 vary in magnitude and direction, thereby improving the accuracy of alignment between the device patterns.

Seventh Embodiment

Figure 14A:
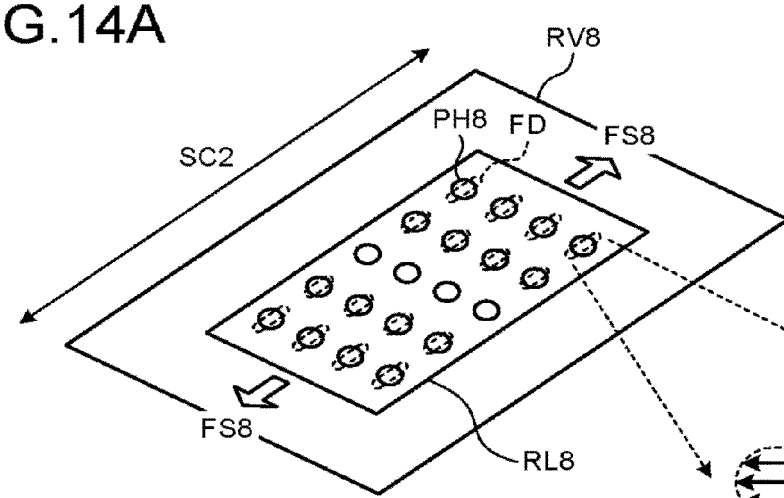
FIG. 14A is a planar view illustrating an example of relationship between stresses and position gaps in a device area to which an alignment method according to a seventh embodiment is applied.
Figure 14B:
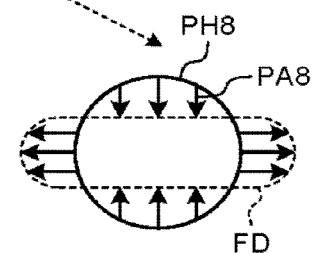
FIG. 14B is a planar view illustrating relationship between position gaps and deformation in device patterns illustrated in FIG. 14A.
Figure 14C:
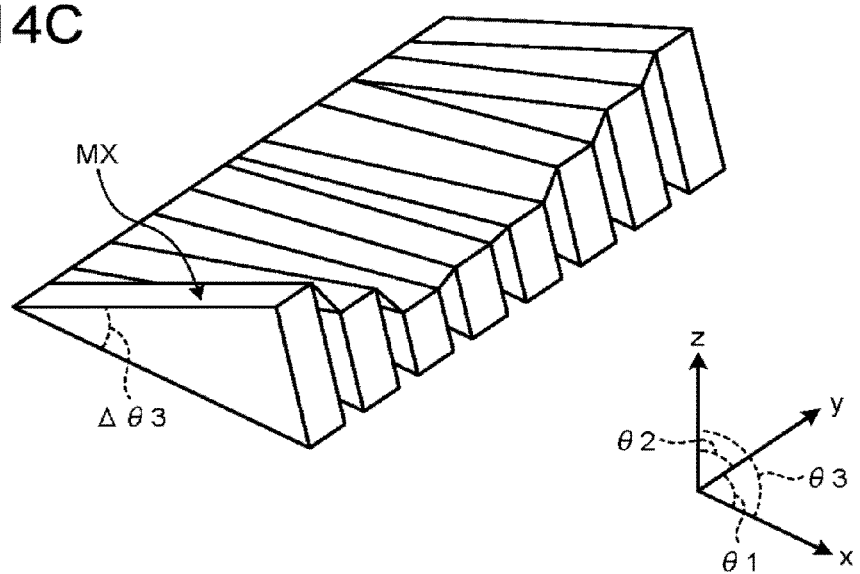
FIG. 14C is a diagram illustrating a controlling method of a wafer stage at the time of scanning with exposure light.

FIG. 14A is a planar view illustrating an example of a relationship between stress and position gap in a device area to which an alignment method according to a seventh embodiment is applied, and FIG. 14B is a planar view illustrating a relationship between position gap and deformation in a device pattern illustrated in FIG. 14A, and FIG. 14C is a diagram illustrating a controlling method of a wafer stage at the time of scanning with exposure light.

Referring to FIG. 14A, the wafer W is provided with a device area RV8. The device area RV8 has a local area RL8 on which a stress FS8 is focused. In the local area RL8, deformations FD of device patterns PH8 result from the stress FS8. FIG. 14A illustrates the state in which the device patterns PH8 are hole patterns. The deformations FD are flattened in the x-axis direction, and the amount of the deformations varies depending on the position of the local area RL8. The deformations FD can be resolved into position gaps PA8 of outlines of the device patterns PH8 as illustrated in FIG. 14B.

As illustrated in FIG. 14C, to control alignment between resist patterns formed on the device patterns PH8, an inclination angle $\Delta\theta 3$ of the stage 16 in a $\theta 3$ direction can be changed according to the deformations FD. By changing the inclination angle $\Delta\theta 3$ of the stage 16 with respect to the reticle 14, the inclination of a stage surface MX can be changed according to the scan position, and an optical axis of the exposure light LX incident on the stage surface MX can be changed in the $\theta 3$ direction. At that time, when the optical axis of the exposure light LX changes in the $\theta 3$ direction, the amount of flatness of the resist patterns in the x-axis direction changes. Accordingly, by changing the inclination of the stage surface MX according to the scan position, it is possible to deform the resist patterns in correspondence with the deformations FD of the device patterns PH8, thereby improving the accuracy of alignment between the device patterns. When there occur position gaps in the device patterns PH8 as illustrated in FIG. 13A together with the deformations FD of the device patterns PH8, it is possible to change simultaneously the inclination and the scan speed of the stage 16 according to the scan position. When the magnification ratio of the resist patterns varies with change in the inclination of the stage 16 according to the scan position, the magnification ratio at the time of exposure can be changed simultaneously.

By changing the plurality of parameters for exposure conditions simultaneously according to the scan position, even when there occur position gaps, deformations, and distortions in combination in the device areas, it is possible to perform alignment between the resist patterns corresponding to the position gaps, deformations, and distortions of the device patterns, and improve the accuracy of alignment between the device patterns.

In this example, it is possible to classify the deformations of the device patterns resulting from the stresses applied to the device patterns, set the classified deformations in correspondence with the parameters for exposure conditions at the exposure device, and control the parameters for exposure condition according to the deformations of the device patterns. Accordingly, even when it is difficult to optimize the parameters for exposure conditions for each of position gaps at setting points in the shot area because of variations in magnitude and direction between the position gaps at the setting points in the shot area, the accuracy of alignment between the device patterns can be improved.

Eighth Embodiment

FIG. 15 is a block diagram illustrating a hardware configuration of a position gap compensation unit according to an eighth embodiment.

Referring to FIG. 15, the position gap compensation unit 18C illustrated in FIG. 3 can be provided with a processor 41 including a CPU or the like, a ROM 42 storing fixed data, a RAM 43 providing a work area and the like for the processor 41, a human interface 44 mediating between a human and a computer, a communication interface 45 providing means for external communications, and an external storage device 46 storing programs for operating the processor 41 and various data. The processor 41, the ROM 42, the RAM 43, the human interface 44, the communication interface 45, and the external storage device 46 are connected together via a bus 47.

The external storage device 46 may be a magnetic disc such as a hard disc, an optical disc such as a DVD, or a portable semiconductor storage device such as a USB memory or a memory card, for example. The human interface 44 may be a keyboard, a mouse, or a touch panel as an input interface, and may be a display, a printer, or the like as an output interface, for example. The communication interface 45 may be a LAN card, a modem, a router, or the like for connection with the internet, a LAN, or the like. A position gap compensation program 46A is installed in the external storage device 46 to compensate for position gaps in the device patterns at the alignment destination. When the position gap compensation program 46A is executed by the processor 41, the exposure conditions at the exposure device illustrated in FIG. 3 are set such that the position gaps of the device patterns at the alignment destination are compensated for.

The position gap compensation program 46A to be executed by the processor 41 may be stored in the external storage device 46 and read into the RAM 43 at the time of execution of the position gap compensation program 46A. The position gap compensation program 46A may be stored in advance in the ROM 42. The position gap compensation program 46A may be acquired via the communication interface 45. The position gap compensation program 46A may be executed by a standalone computer or a cloud computer.

Ninth Embodiment

Figure 16:
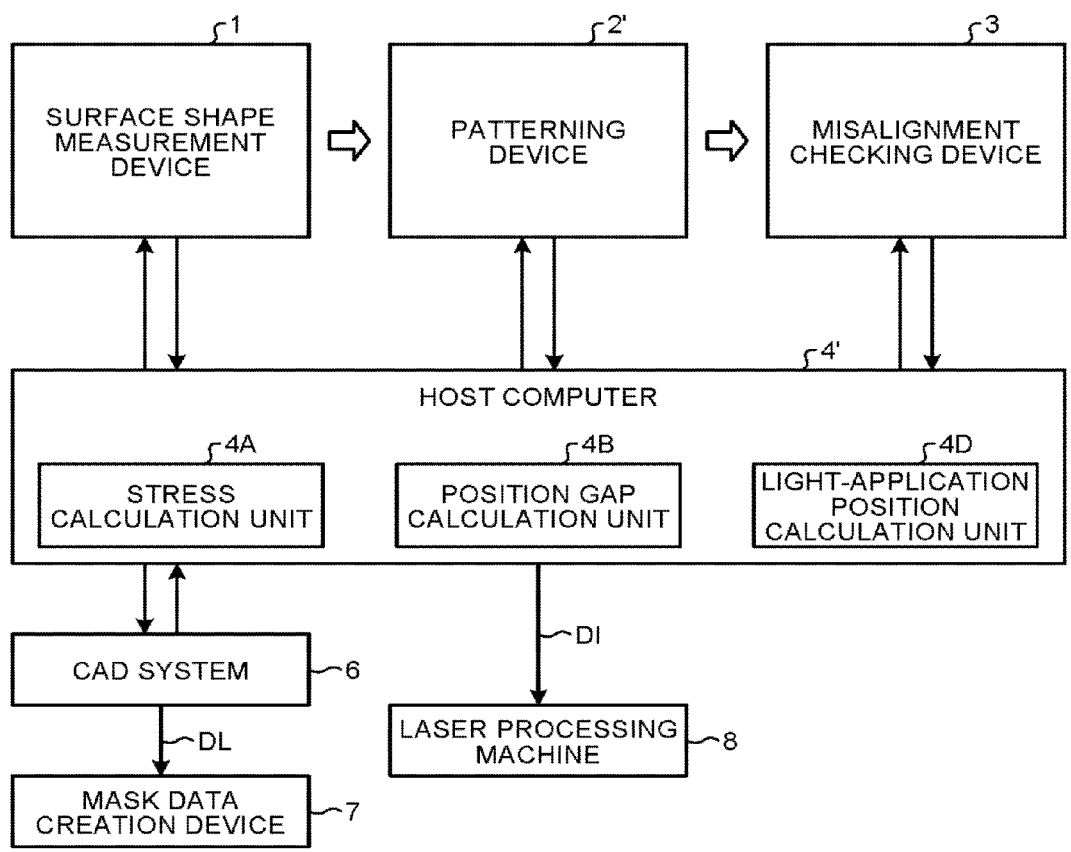
FIG. 16 is a schematic block view of a pattern formation system according to a ninth embodiment.

FIG. 16 is a schematic block diagram of a pattern formation system according to a ninth embodiment.

Referring to FIG. 16, the pattern formation system is provided with a patterning device 2' and a host computer 4' instead of the patterning device 2 and the host computer 4 illustrated in FIG. 1. The pattern formation system is further provided with a CAD system 6, a mask data creation device 7, and a laser processing machine 8. The laser processing machine 8 may be a femtosecond laser, for example. The surface shape measurement device 1, the patterning device 2', and the misalignment checking device 3 are capable of data communications with the host computer 4'. The patterning device 2' may be an exposure device or a nanoimprint device. The host computer 4' is provided with a stress calculation unit 4A, a position gap calculation unit 4B, and a light-application position calculation unit 4D. The light-application position calculation unit 4D calculates the position where laser light is applied to the original plate. The original plate is a reticle at the exposure device and is a template at the nanoimprint device.

The CAD system 6 creates designed layout data DL for a semiconductor integrated circuit and sends the same to the mask data creation device 7. The mask data creation unit 7 creates mask data corresponding to a designed layout pattern specified by the designed layout data DL. A slit pattern corresponding to the mask data created by the mask data creation unit 7 is formed on a light-shielding film of the reticle. A concave pattern or a convex pattern corresponding to the mask data created by the mask data creation unit 7 is formed on the template.

FIG. 16 illustrates the configuration in which the surface shape measurement device 1 is provided in the pattern formation system. Alternatively, the stress measurement device 5 may be provided in the pattern formation system as illustrated in FIG. 12.

Figure 17:
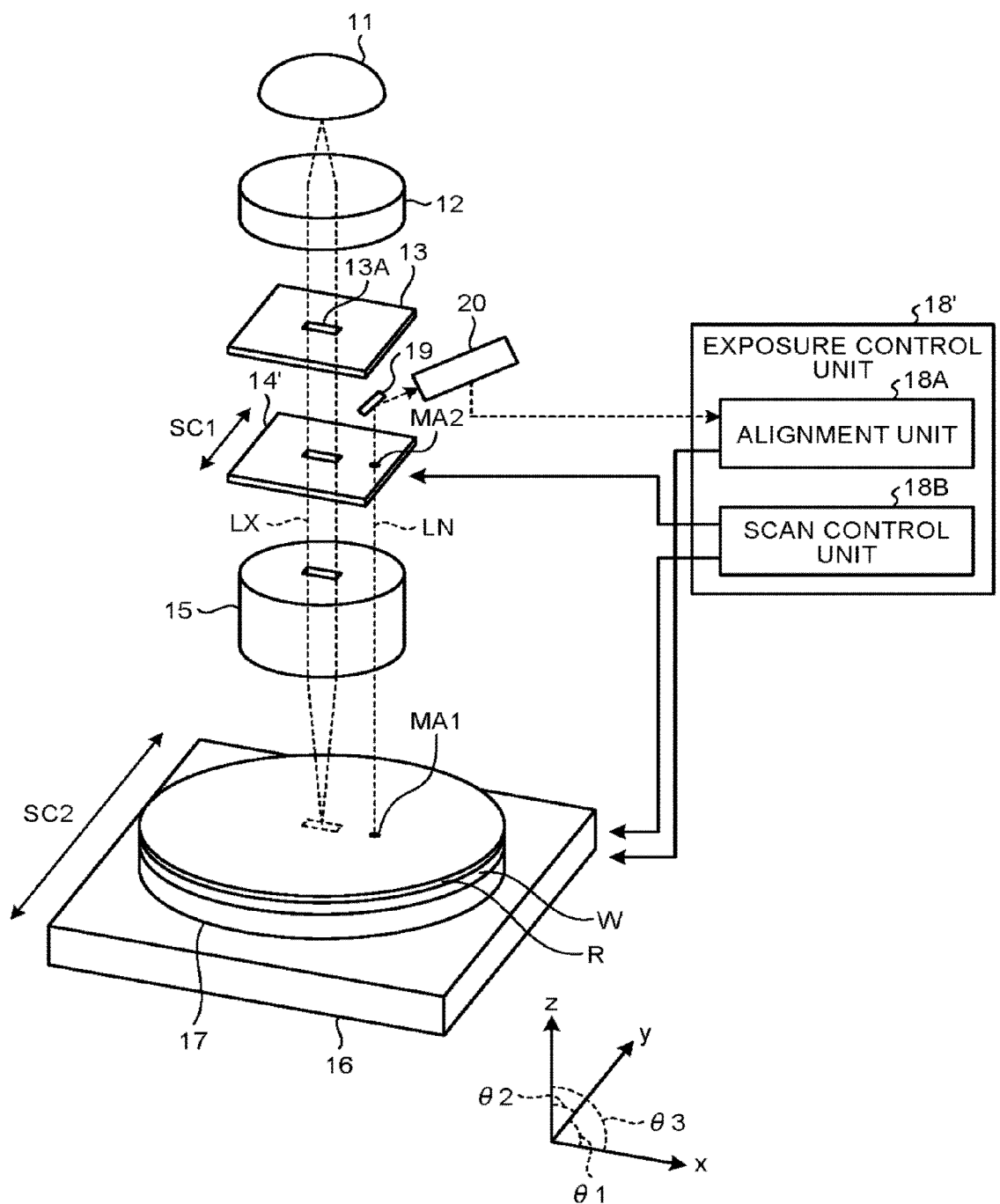
FIG. 17 is a schematic perspective diagram of an exposure device applied to the pattern formation system illustrated in FIG. 16.

FIG. 17 is a schematic perspective view of an exposure device applied to the pattern formation system illustrated in FIG. 16.

The exposure device of FIG. 17 is provided with an exposure control unit 18' instead of the exposure control unit 18 illustrated in FIG. 3. The exposure control unit 18' includes an alignment unit 18A and a scan control unit 18B. In the exposure device, a reticle 14' can be used instead of the reticle 14 illustrated in FIG. 3.

Figure 18A:
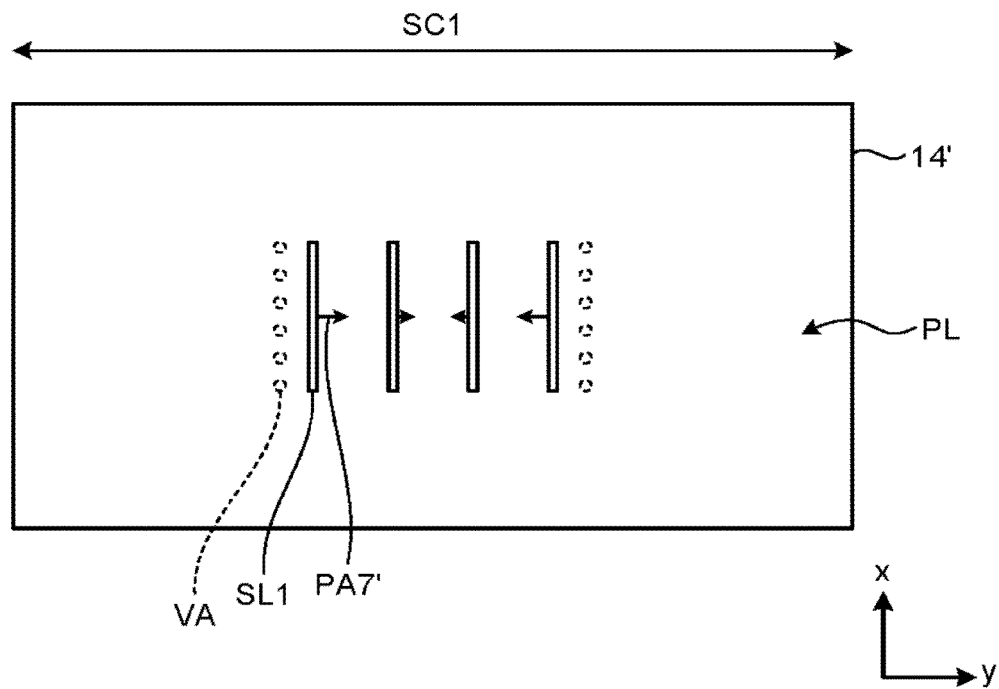
FIG. 18A is a planar view illustrating an example of a configuration of a reticle applied to the exposure device illustrated in FIG. 17.
Figure 18B:
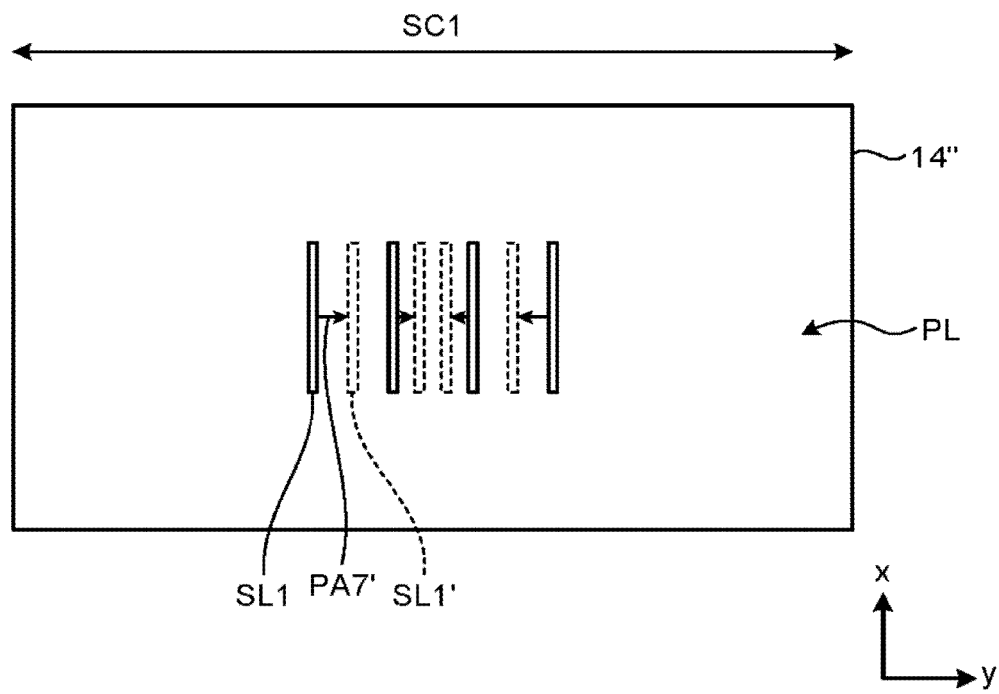
FIG. 18B is a planar view illustrating another example of a configuration of a reticle applied to the exposure device illustrated in FIG. 17.

FIG. 18A is a planar view illustrating an example of a configuration of a reticle applied to the exposure device illustrated in FIG. 17, and FIG. 18B is a planar view illustrating another example of a configuration of a reticle applied to the exposure device illustrated in FIG. 17.

The reticle 14' illustrated in FIG. 18A is applied to the device area RV7 illustrated in FIG. 13A. A light-shielding film PL is provided on the reticle 14', and slit patterns SL1 are formed on the light-shielding film PL. The reticle 14' has holes VA. The holes VA can be formed inside the reticle 14' so as to prevent dust from entering the holes VA. The holes VA generate a stress on the reticle 14'. The stress causes position gaps PA7' in the slit patterns SL1. The position gaps PA7' of the slit patterns SL1 can correspond to the position gaps PA7 of the device patterns PH7.

The designed layout data DL for the slit patterns SL1 created by the CAD system 6 and the position gaps PA7 of the device patterns PH7 calculated by the position gap calculation unit 4B are sent to the light-application position calculation unit 4D illustrated in FIG. 16. The light-application position calculation unit 4D calculates light-application positions DI for the holes VA generating the position gaps PA7' corresponding to the position gaps PA7, and sends the calculated results to the laser processing machine 8. The laser processing machine 8 applies femtosecond laser to the reticle 14' according to the light-application positions DI to form the holes VA in the reticle 14'.

By changing the light-application positions for the holes VA, it is possible to improve the degrees of freedom in the position gap amount and position gap direction of the slit patterns SL1. Accordingly, it is possible to handle various position gaps that cannot be handled by exposure control and improve the accuracy of alignment between the device patterns.

In the exposure device of FIG. 17, a reticle 14" illustrated in FIG. 18B may be used instead of the reticle 14' illustrated in FIG. 18A. The reticle 14" is applied to the device area RV7 illustrated in FIG. 13A. A light-shielding film PL is provided on the reticle 14", and slit patterns SL1' are formed on the light-shielding film PL instead of the slit patterns SL1. The slit patterns SL1' have position gaps PA7' with respect to the slit patterns SL1. The position gaps PA7' of the slit patterns SL1' can correspond to the position gaps PA7 of the device patterns PH7.

Information on the position gaps PA7 of the device patterns PH7 calculated by the position gap calculation unit 4B is sent to the CAD system 6 illustrated in FIG. 16. Designed layout data DL in which the arrangement positions of the slit patterns SL1 are corrected by the position gaps PA7 is sent to the mask data creation device 7. The mask data creation device 7 creates mask data corresponding to the designed layout pattern specified by the designed layout data DL. The slit patterns SL1' including the position gaps PA7' with respect to the slit patterns SL1 are formed on the light-shielding film PL of the reticle 14'.

By changing the designed layout data DL according to the position gaps PA7, it is possible to handle various position gaps that cannot be handled by exposure control and improve the accuracy of alignment between the device patterns.

Tenth Embodiment

Figure 19:
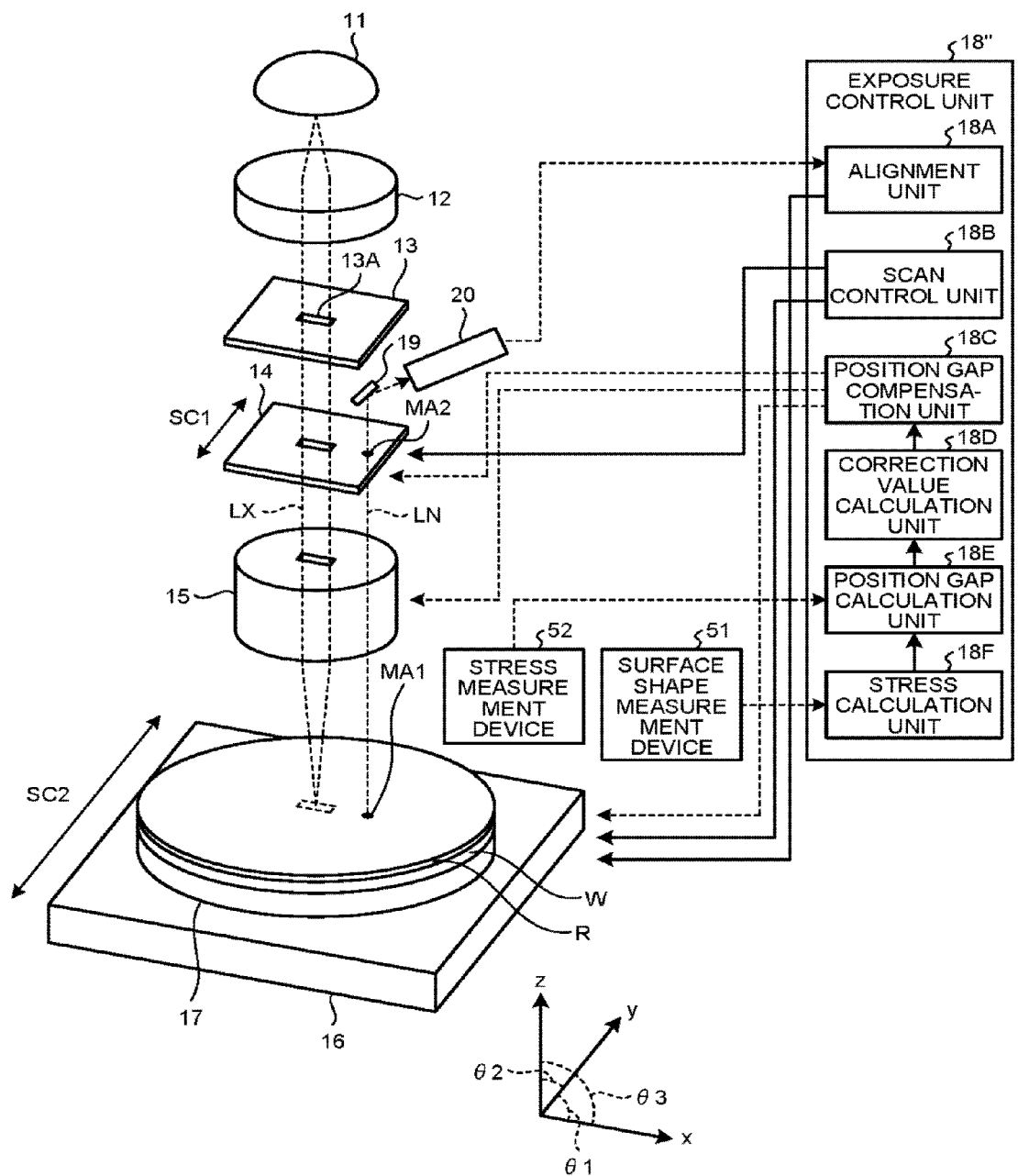
FIG. 19 is a schematic perspective view of an exposure device according to a tenth embodiment.

FIG. 19 is a schematic perspective view of an exposure device according to a tenth embodiment.

Referring to FIG. 19, the exposure device is provided with an exposure control unit 18" instead of the exposure control unit 18 illustrated in FIG. 3. The exposure device is also provided with a surface shape measurement device 51 and a stress measurement device 52. Alternatively, the exposure device may be provided with only one of the surface shape measurement device 51 and the stress measurement device 52. The exposure control unit 18" includes an alignment unit 18A, a scan control unit 18B, a position gap compensation unit 18C, a correction value calculation unit 18D, a position gap calculation unit 18E, and a stress calculation unit 18F. The surface shape measurement device 51 can operate in the same manner as the surface shape measurement device 1 illustrated in FIG. 1. The stress measurement device 52 can operate in the same manner as the stress measurement device 5 illustrated in FIG. 12. The correction value calculation unit 18D can operate in the same manner as the correction value calculation unit 4C illustrated in FIG. 1. The position gap calculation unit 18E can operate in the same manner as the position gap calculation unit 4B illustrated in FIG. 1. The stress calculation unit 18F can operate in the same manner as the stress calculation unit 4A illustrated in FIG. 1.

The wafer W with the resist film R applied is delivered onto the chuck 17. An alignment destination pattern is formed on the wafer W in the device area before the application of the resist film R. The chuck 17 sucks the wafer W to fix the wafer W onto the chuck 17.

The surface shape measurement device 51 measures the surface shape of the wafer W and sends the results of measurement to the stress calculation unit 18F. The stress calculation unit 18F calculates the stresses applied to the device areas of the wafer W based on the results of measurement from the surface shape measurement device 51, and sends the results of calculation to the position gap calculation unit 18E. At that time, instead of measuring the surface shape of the wafer by the surface shape measurement device 51, the stress measurement device 52 may measure the stresses applied to the device areas of the wafer W and send the results of calculation to the position gap calculation unit 18E. The measurement of the surface shape by the surface shape measurement device 51 and the measurement of the stresses by the stress measurement device 52 may be performed on the wafer W fixed to the chuck 17 or the wafer W not fixed to the chuck 17. By measuring the surface shape of or the stress on the wafer W fixed to the chuck 17, it is possible to incorporate fluctuations in the surface shape of or the stresses on the wafer W fixed to the chuck 17 into the measurement values.

The position gap calculation unit 18E calculates position gaps of predetermined points in the device areas based on the results of calculation from the stress calculation unit 18F, and sends the results of position gap calculation to the correction value calculation unit 18D. The correction value calculation unit 18D calculates the correction values for exposure control in the lithography process of the device areas based on the results of calculation from the position gap calculation unit 18E, and sends the correction values to the position gap compensation unit 18C.

The alignment marks MA1 and MA2 are irradiated with the non-exposure light LN, and the non-exposure light LN is entered into the alignment detection system 20 via the reflection system 19. The alignment unit 18A adjusts the position of the stage 16 such that the alignment marks MA1 and MA2 are superposed, thereby to perform alignment between the reticle 14 and the shot area.

Next, the light source 11 emits the exposure light LX. The exposure light LX is converted into parallel light by the illumination lens 12, and guided to the slit plate 13 and shaped in a slit form. The exposure light TX shaped in a slit form enters the reticle 14. The exposure light LX having passed through the reticle 14 is projected onto the wafer W by the projection optical system 15 to expose the resist film R to the light. In the scan and repeat mode, while the exposure light LX is projected onto the wafer W, the reticle 14 and the stage 16 are scanned in synchronization along the scan direction DS illustrated in FIG. 2A. The position gap compensation unit 18C controls the exposure conditions for the resist film R based on the correction values calculated by the correction value calculation unit 4C.

As described above, in the configuration of FIG. 19, the surface shape of or the stress on the wafer W can be measured on the stage 16, and exposure control can be performed based on the results of measurement. Accordingly, the actual state of the wafer W at the time of exposure can reflect faithfully on the results of measurement of the surface shape of or the stress on the wafer W, thereby further improving the accuracy of alignment between the device patterns.

In the configuration of FIG. 19, it is not necessary to deliver the wafer W between the surface shape measurement device 1 illustrated in FIG. 1 or the stress measurement device 5 illustrated in FIG. 12 and the patterning device 2, thereby achieving improvement in throughput.

In the foregoing embodiments, a projection lens is used in the projection optical system of the exposure device. Alternatively, a projection mirror may be used in a projection optical system of an EUV (extreme ultra violet) exposure device or the like.

Eleventh Embodiment

Figure 20:
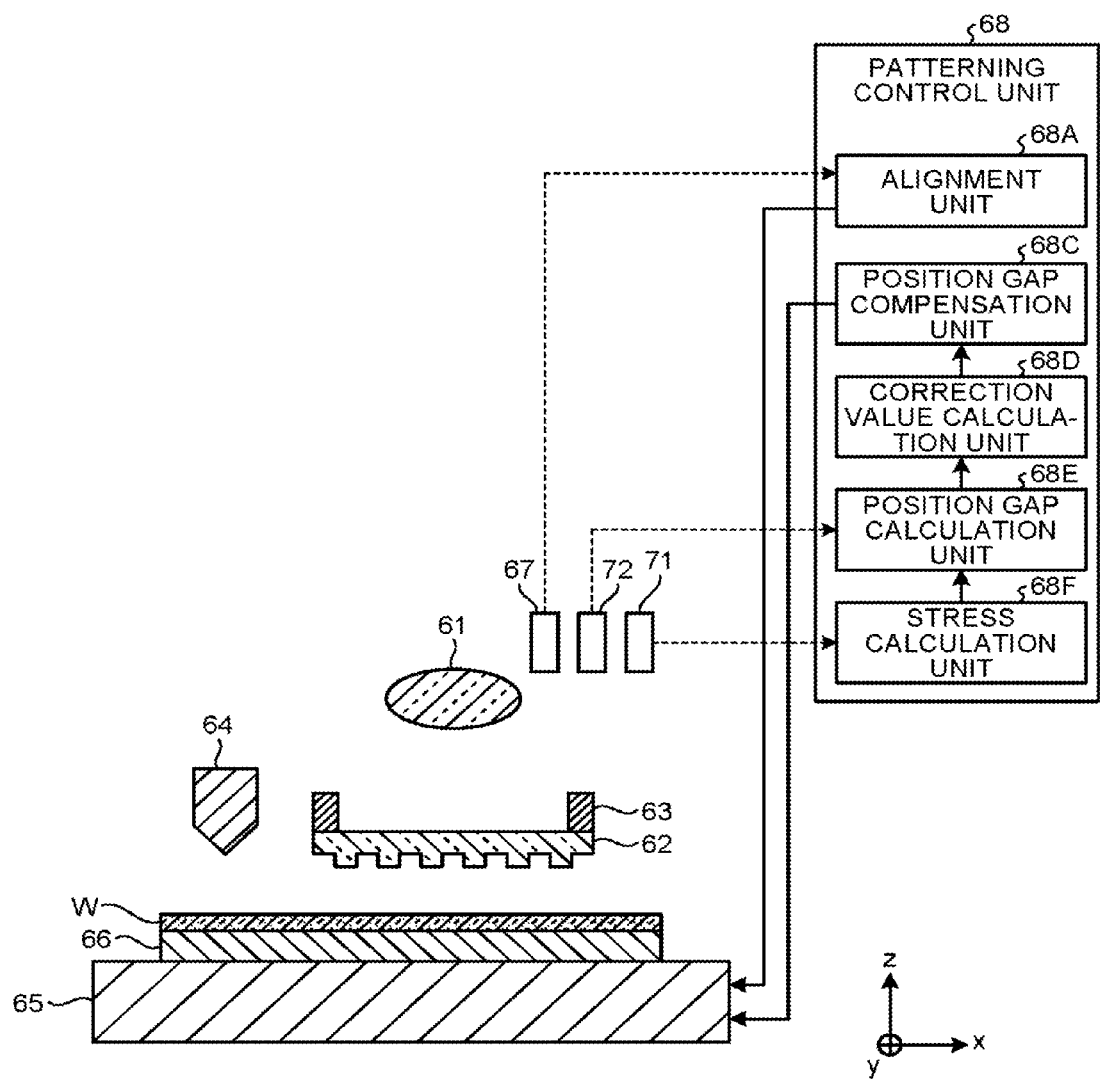
FIG. 20 is a schematic cross-sectional view of an imprint device according to an eleventh embodiment.

FIG. 20 is a schematic cross-sectional view of an imprint device according to an eleventh embodiment.

Referring to FIG. 20, the imprint device is provided with a light source 61 that irradiates the wafer W with ultraviolet light, a press unit 63 that presses a template 62 on the wafer W, a nozzle 64 that discharges an imprint material onto the wafer W, a stage 65 on which the wafer W is placed, a chuck 66 that sucks the wafer W, and an alignment detection system 67 that detects alignment marks. The imprint device is also provided with a surface shape measurement device 71 and a stress measurement device 72. The imprint device may be provided with only one of the surface shape measurement device 71 and the stress measurement device 72. The stage 65 can be moved in the x-axis, y-axis, and z-axis directions, rotated in the $\theta 1$ direction, and inclined in the $\theta 2$ or $\theta 3$ direction, as the stage 16 illustrated in FIG. 3A. The imprint device is provided with a patterning control unit 68 that controls the pressing position of the template 62. The patterning control unit 68 includes an alignment unit 68A, a position gap compensation unit 68C, a correction value calculation unit 68D, a position gap calculation unit 68E, and a stress calculation unit 68F.

The surface shape measurement device 71 can operate in the same manner as the surface shape measurement device 1 illustrated in FIG. 1. The stress measurement device 72 can operate in the same manner as the stress measurement device 5 illustrated in FIG. 12. The correction value calculation unit 68D can operate in the same manner as the correction value calculation unit 4C illustrated in FIG. 1. In the imprint device, the parameters for exposure control may not be capable of being changed and thus the parameters can be set so as not to be handled. For example, the magnification ratio can be changed at the exposure device illustrated in FIG. 19, whereas the magnification ratio cannot be changed at the imprint device illustrated in FIG. 20. To change the magnification ratio at the imprint device, the imprint device may be provided with a heating unit that heats the template 62 or a cooling unit that cools the template 62. By heating or cooling the template 62, the template 62 can be thermally expanded or contracted to change the magnification ratio at the imprint device. The position gap calculation unit 68E can operate in the same manner as the position gap calculation unit 4B illustrated in FIG. 1. The stress calculation unit 68F can operate in the same manner as the stress calculation unit 4A illustrated in FIG. 1. The alignment unit 68A performs alignment between the template 62 and the shot area based on the positions of the alignment marks detected by the alignment detection system 67. The position gap compensation unit 68C corrects the pressing position of the template 62 based on the correction values calculated by the correction value calculation unit 68D. At the correction of the pressing position, at least one of the positions of the stage 65 relative to the template 62, the inclination of the stage 65 relative to the template 62, and the rotation angle of the stage 65 relative to the template 62 can be corrected.

The wafer W with the alignment destination patterns formed in the device areas is delivered onto the chuck 66. The chuck 66 sucks the wafer W to fix the wafer W onto the chuck 66. The surface shape measurement device 71 measures the surface shape of the wafer W and sends the results of measurement to the stress calculation unit 68F. The stress calculation unit 68F calculates the stresses applied to the device areas of the wafer W based on the results of measurement from the surface shape measurement device 71, and sends the results of calculation to the position gap calculation unit 68E. At that time, instead of measuring the surface shape of the wafer W by the surface shape measurement device 71, the stress measurement device 72 may measure the stresses applied to the device areas of the wafer W and send the results of calculation to the position gap calculation unit 68E. The position gap calculation unit 68E calculates position gaps of predetermined points in the device areas based on the results of calculation from the stress calculation unit 68F, and sends the results of the position gap calculation to the correction value calculation unit 68D. The correction value calculation unit 68D calculates the correction values for the pressing position of the device areas based on the results of calculation from the position gap calculation unit 68E, and sends the correction values to the position gap compensation unit 68C.

An imprint material is discharged from the nozzle 64 onto the wafer W by use of ink-jet method or the like. The alignment detection system 67 detects alignment light from the alignment marks. The alignment unit 68A performs alignment between the template 62 and the shot area of the wafer W based on the results of detection by the alignment detection system 67.

The template 62 is pressed against the imprint material on the wafer W to form an imprint pattern on the wafer W. When the template 62 is pressed against the imprint material on the wafer W, the position gap compensation unit 68C corrects the pressing position of the template 62 based on the correction values from the correction value calculation unit 68D.

The light source 61 irradiates the imprint material with ultraviolet rays through the template 62 while the template 62 is pressed against the imprint material to harden the imprint material.

As described above, in the configuration of FIG. 20, it is possible to measure the surface shape of or the stress on the wafer W on the stage 65 and correct the pressing position based on the results of measurement. Accordingly, the actual state of the wafer W before the pressing can reflect faithfully on the results of measurement of the surface shape of or the stress on the wafer W, thereby improving the accuracy of alignment between the device patterns.

In the configuration of FIG. 20, it is not necessary to deliver the wafer W between the surface shape measurement device 1 and the patterning device 2 illustrated in FIG. 1, thereby achieving improvement in throughput.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation system, comprising:
 a patterning device that forms a pattern on a wafer in a device area;
 a misalignment checking device that checks a misalignment between superposition checking marks on the wafer; and
 a host computer that is connected to the patterning device and the misalignment checking device, wherein
 the host computer includes:
 a position gap calculation unit that calculates a position gap of a predetermined point in the device area and a position gap of the superposition checking marks, based on a stress applied to the device area of the wafer; and
 a correction value calculation unit that calculates a correction value for a control parameter in a patterning process of the device area, based on the position gap of the predetermined point in the device area and the position gap of the superposition checking marks, and
 the patterning device includes a position gap compensation unit that sets the control parameter in the patterning process of the device area based on the correction value.

2. The pattern formation system of claim 1, further comprising a surface shape measurement device that measures the surface shape of the wafer, wherein
 the host computer further includes a stress calculation unit that calculates the stress applied to the device area of the wafer based on the surface shape of the wafer.

3. The pattern formation system claim 1, further comprising a stress measurement device that measures the stress applied to the device area of the wafer.

4. An exposure device, comprising:
 a stage on which a wafer is placed;

a projection optical system that projects exposure light onto the wafer;

a scan control unit that moves the stage and a reticle in synchronization to scan the wafer with exposure light;

a stress measurement device that measures a stress applied to a device area of the wafer;

a position gap calculation unit that calculates a position gap of a predetermined point in the device area based on the stress; and a position gap compensation unit that performs, based on the position gap, an exposure control in a lithography process of the device area.

5. The exposure device of claim 4, wherein the position gap compensation unit performs the exposure control in the lithography process of the device area, based on an amount of deformation or distortion of a pattern in the device area calculated based on the stress applied to the device area of the wafer.

6. The exposure device of claim 5, wherein a parameter for the exposure control is changed according to a scan position of the exposure light.

7. The exposure device of claim 5, wherein at least one of a scan speed of the stage relative to the reticle, an inclination of the stage relative to the reticle, a rotation angle of the stage relative to the reticle, and a magnification ratio of a pattern projected onto the wafer by the exposure light, is changed according to a scan position of the exposure light.

8. An exposure device, comprising:

a stage on which a wafer is placed;

a projection optical system that projects exposure light onto the wafer;

a scan control unit that moves the stage and a reticle in synchronization to scan the wafer with exposure light;

a surface shape measurement device that measures a surface shape of the wafer;

a stress calculation unit that calculates a stress applied to a device area of the wafer based on the surface shape;

a position gap calculation unit that calculates a position gap of a predetermined point in the device area base on the stress; and a position gap compensation unit that performs, based on the position gap, an exposure control in a lithography process of the device area.

9. The exposure device of claim 8, wherein the position gap compensation unit performs the exposure control in the lithography process of the device area, based on an amount of deformation or distortion of a pattern in the device area calculated based on the stress applied to the device area of the wafer.

10. The exposure device of claim 9, wherein a parameter for the exposure control is changed according to a scan position of the exposure light.

11. The exposure device of claim 9, wherein at least one of a scan speed of the stage relative to the reticle, an inclination of the stage relative to the reticle, a rotation angle of the stage relative to the reticle, and a magnification ratio of a pattern projected onto the wafer by the exposure light, is changed according to a scan position of the exposure light.

\* \* \* \* \*